(12) United States Patent
Kang et al.

(10) Patent No.: US 12,464,866 B2
(45) Date of Patent: Nov. 4, 2025

(54) DISPLAY DEVICE USING SEMICONDUCTOR LIGHT EMITTING ELEMENTS, AND METHOD FOR MANUFACTURING SAME

(71) Applicant: LG ELECTRONICS INC., Seoul (KR)

(72) Inventors: Byungjun Kang, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 707 days.

(21) Appl. No.: 17/780,779

(22) PCT Filed: Feb. 11, 2020

(86) PCT No.: PCT/KR2020/001889
§ 371 (c)(1),
(2) Date: May 27, 2022

(87) PCT Pub. No.: WO2021/107273
PCT Pub. Date: Jun. 3, 2021

(65) Prior Publication Data
US 2022/0416128 A1 Dec. 29, 2022

(30) Foreign Application Priority Data
Nov. 29, 2019 (KR) .......................... 10-2019-0157439

(51) Int. Cl.
*H01L 25/075* (2006.01)
*H10H 20/01* (2025.01)
(Continued)

(52) U.S. Cl.
CPC ...... *H10H 20/8312* (2025.01); *H01L 25/0753* (2013.01); *H10H 20/01* (2025.01);
(Continued)

(58) Field of Classification Search
CPC ............. H10H 20/8312; H10H 20/857; H10H 20/032; H10H 20/0364; H10H 20/0133;
(Continued)

(56) References Cited

U.S. PATENT DOCUMENTS

2010/0264442 A1* 10/2010 Lee ...................... H10H 20/832
438/33
2012/0049214 A1* 3/2012 Lowes ................ H01L 25/0753
257/E33.056
(Continued)

FOREIGN PATENT DOCUMENTS

CN 109791939 A 5/2019
JP 2014-220475 A 11/2014
(Continued)

*Primary Examiner* — Thanh Y. Tran
(74) *Attorney, Agent, or Firm* — Birch, Stewart, Kolasch & Birch, LLP

(57) ABSTRACT

The present invention relates to a method for manufacturing a display device, and more particularly, to a method for manufacturing a display device using a semiconductor light emitting device having a size of several μm to several tens of μm, and to an assembly substrate used for manufacturing the display device. The present invention provides a display device, characterized in that including a substrate having a wiring electrode, a plurality of semiconductor light emitting devices electrically connected to the wiring electrode, and a passivation layer formed to cover the semiconductor light emitting device, and the passivation layer is formed to cover only a portion of a side surface of the semiconductor light emitting device.

17 Claims, 17 Drawing Sheets

(a)

(b)

(51) Int. Cl.
*H10H 20/831* (2025.01)
*H10H 20/857* (2025.01)

(52) U.S. Cl.
CPC ......... *H10H 20/857* (2025.01); *H10H 20/032* (2025.01); *H10H 20/0364* (2025.01)

(58) Field of Classification Search
CPC .... H10H 20/84; H10H 20/013; H10H 20/815; H10H 29/142; H01L 25/0753
See application file for complete search history.

(56) References Cited

U.S. PATENT DOCUMENTS

| | | |
|---|---|---|
| 2014/0361321 A1 | 12/2014 | Saito et al. |
| 2016/0336484 A1 | 11/2016 | McGroddy et al. |
| 2017/0104009 A1 | 4/2017 | Peng et al. |
| 2018/0323178 A1 | 11/2018 | Meitl et al. |
| 2019/0067525 A1 | 2/2019 | Xu et al. |
| 2021/0336095 A1 | 10/2021 | Chen et al. |

FOREIGN PATENT DOCUMENTS

| | | |
|---|---|---|
| JP | 2014-239171 A | 12/2014 |
| KR | 10-2003-0073054 A | 9/2003 |
| KR | 10-2012-0047448 A | 5/2012 |
| KR | 10-2019-0076690 A | 7/2019 |
| KR | 10-2019-0122113 A | 10/2019 |
| KR | 10-2019-0122117 A | 10/2019 |
| KR | 10-2019-0122118 A | 10/2019 |
| KR | 10-2019-0126261 A | 11/2019 |

\* cited by examiner

[FIG. 1]
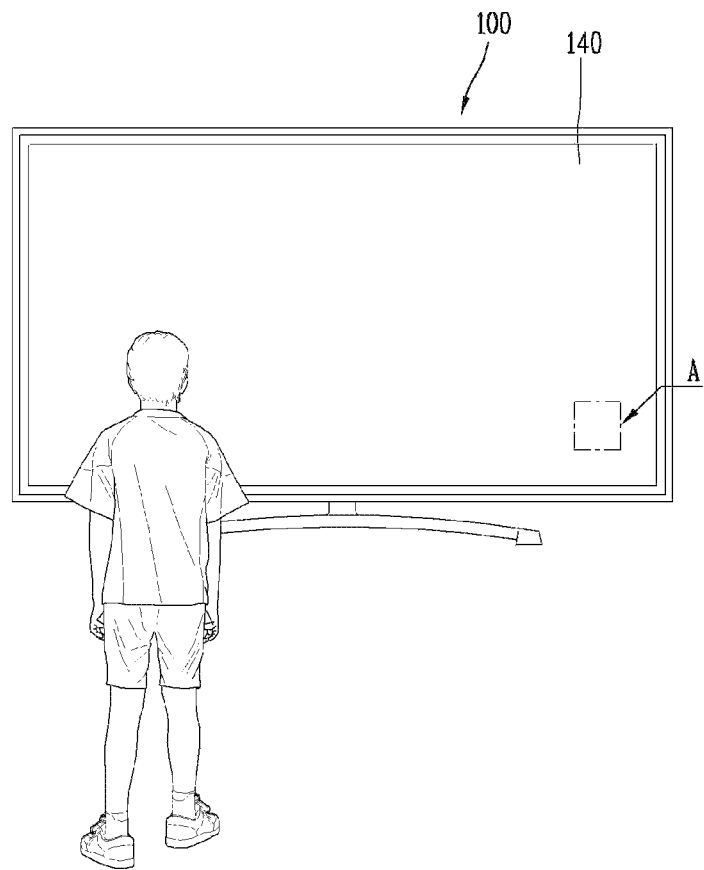

[FIG. 2]
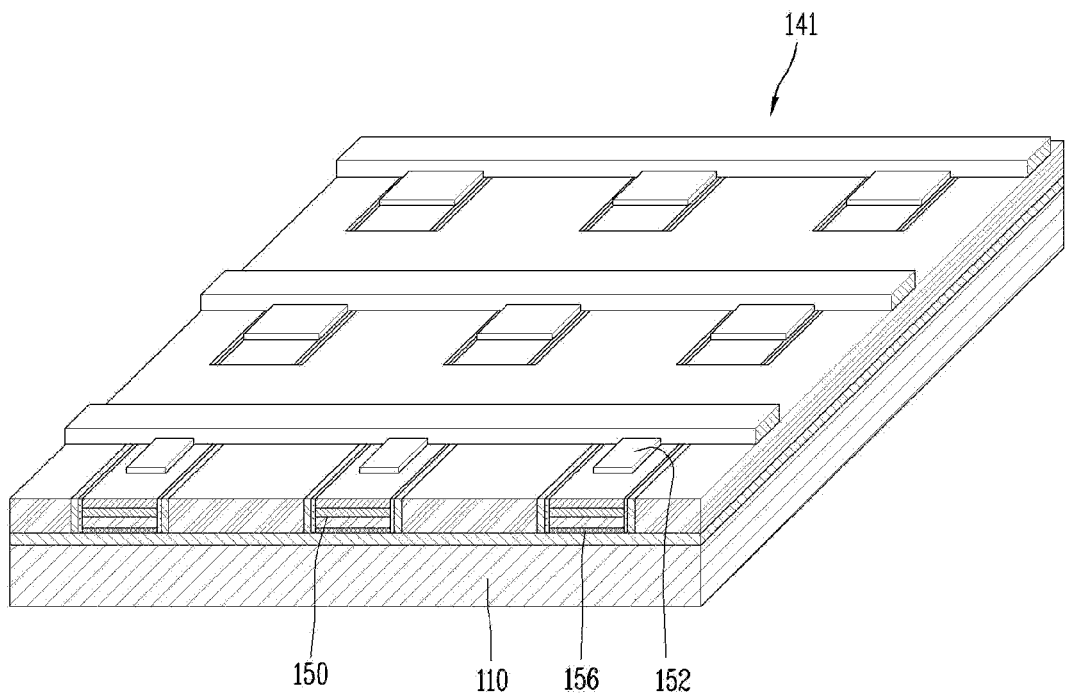
[FIG. 3]
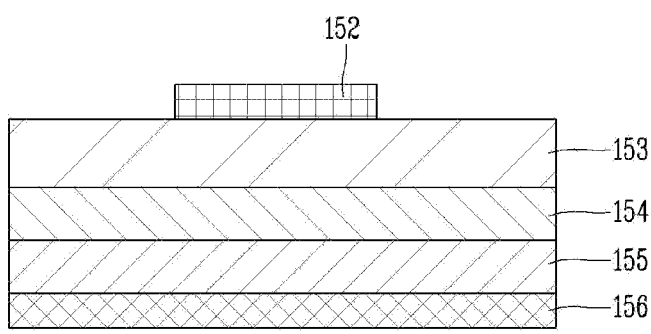

[FIG. 4]
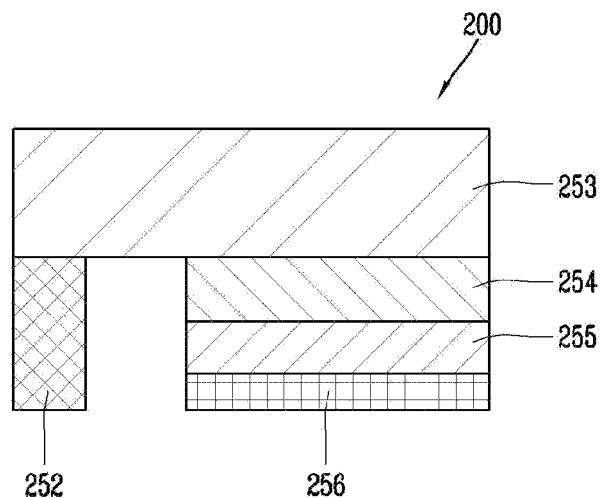
[FIG. 5a]
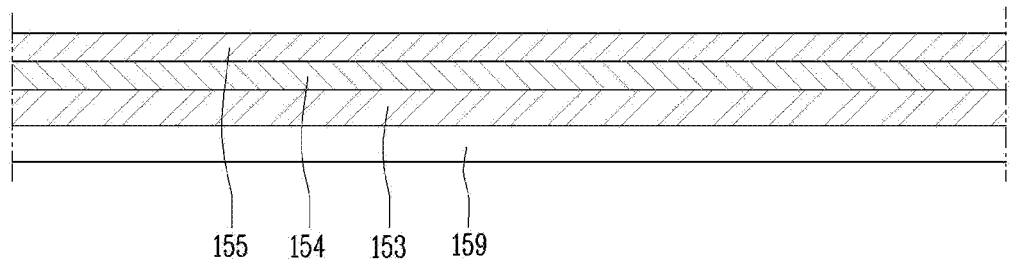
[FIG. 5b]
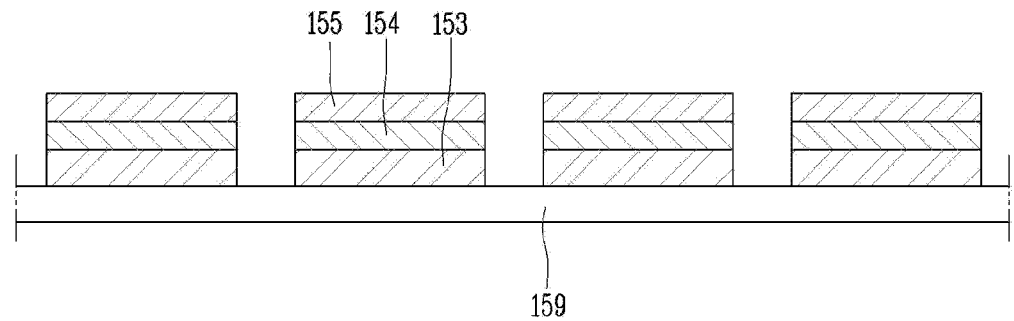

[FIG. 5c]
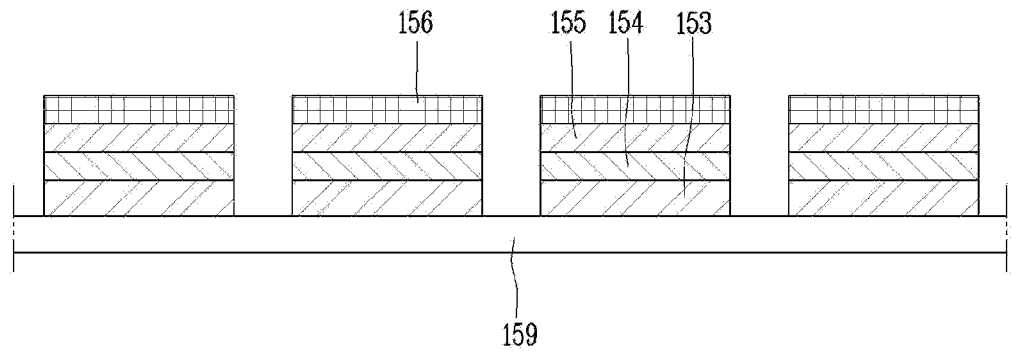
[FIG. 5d]
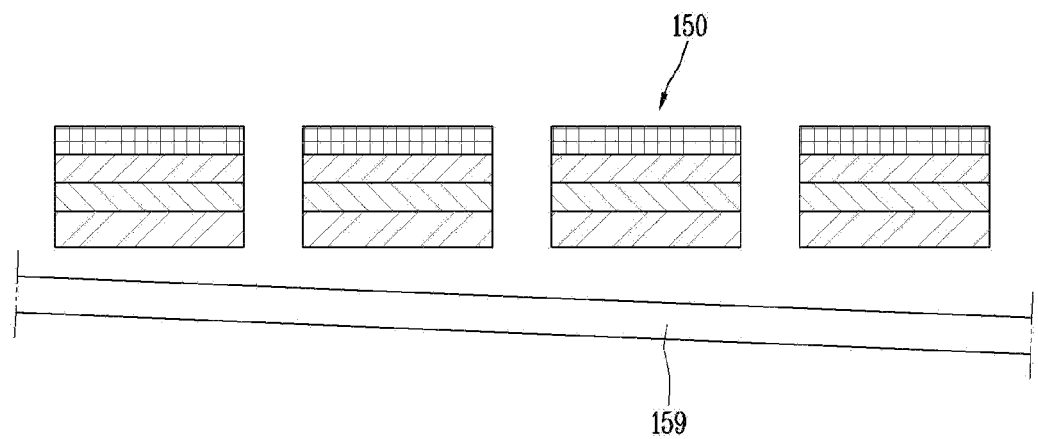
[FIG. 5e]
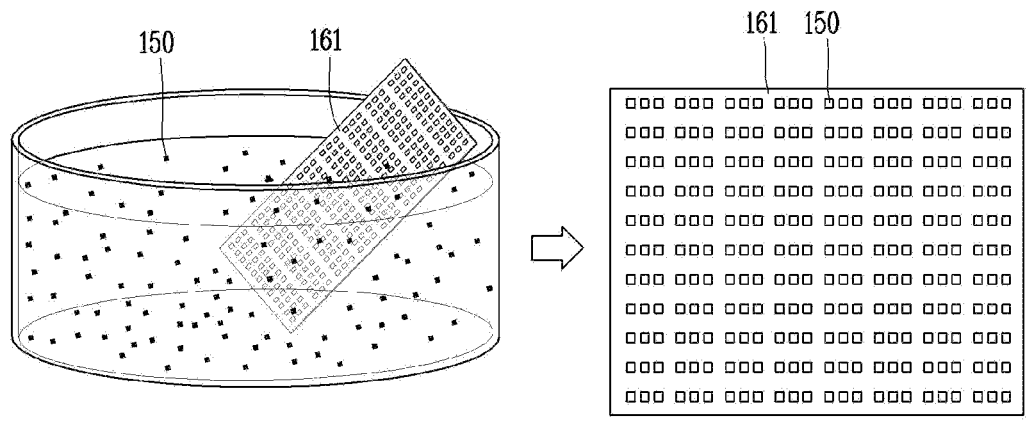

[FIG. 6]
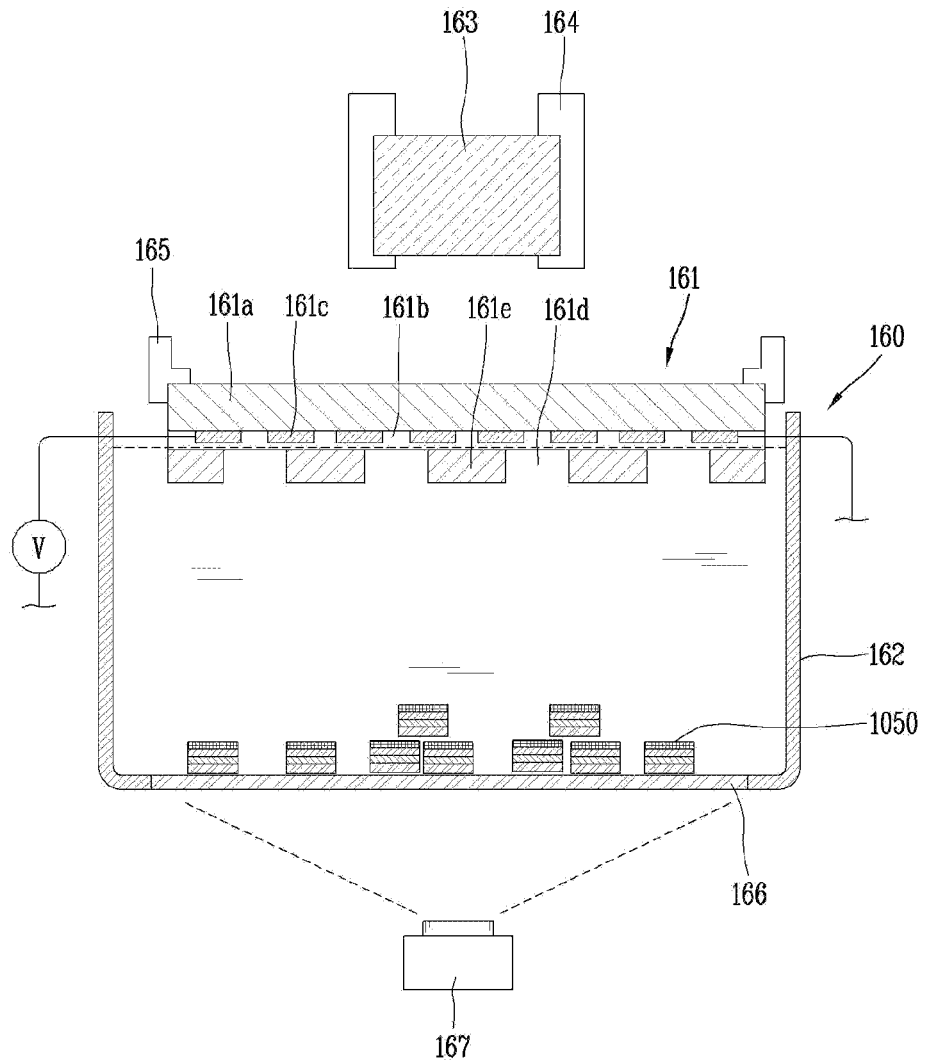

[FIG. 7]
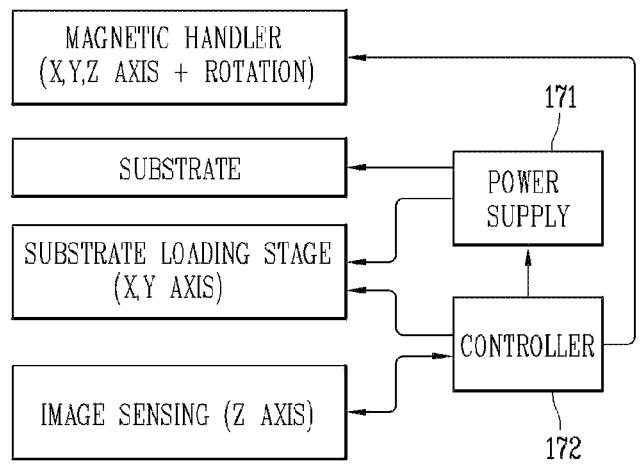
[FIG. 8a]
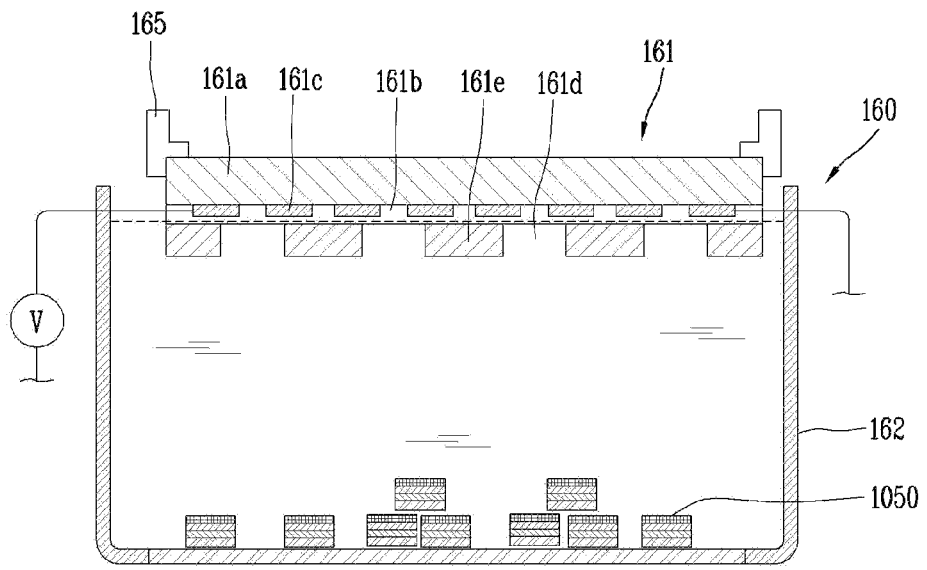

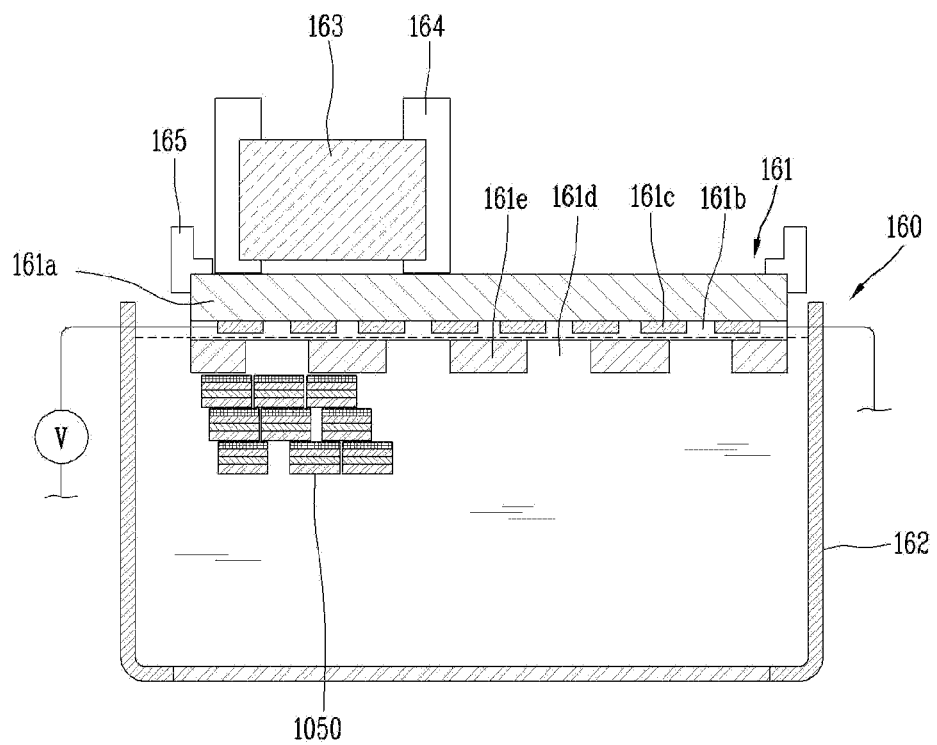
[FIG. 8b]

[FIG. 8c]
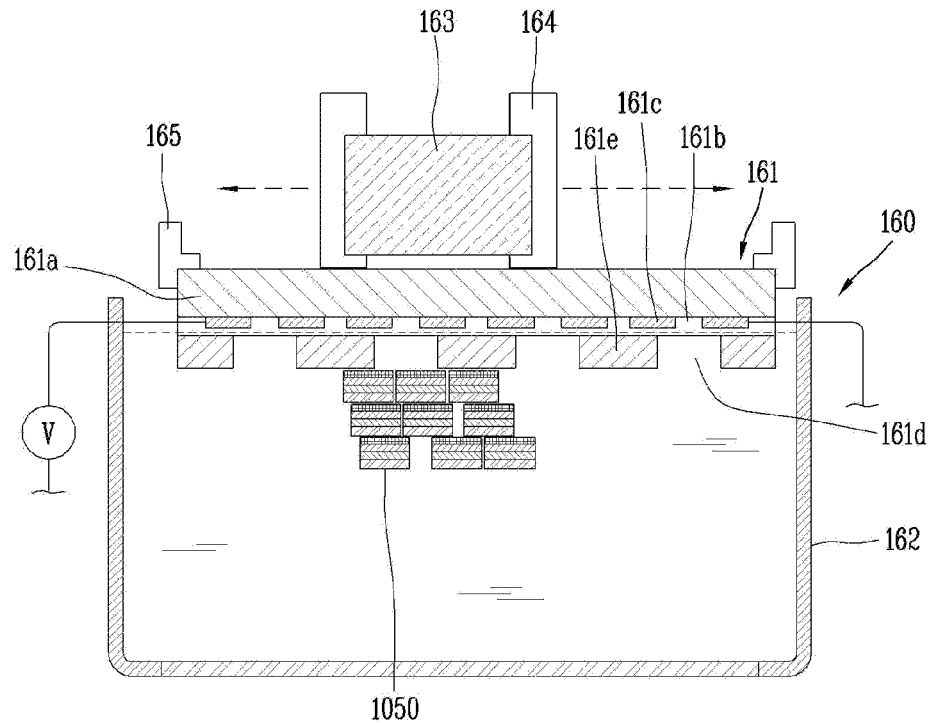
[FIG. 8d]
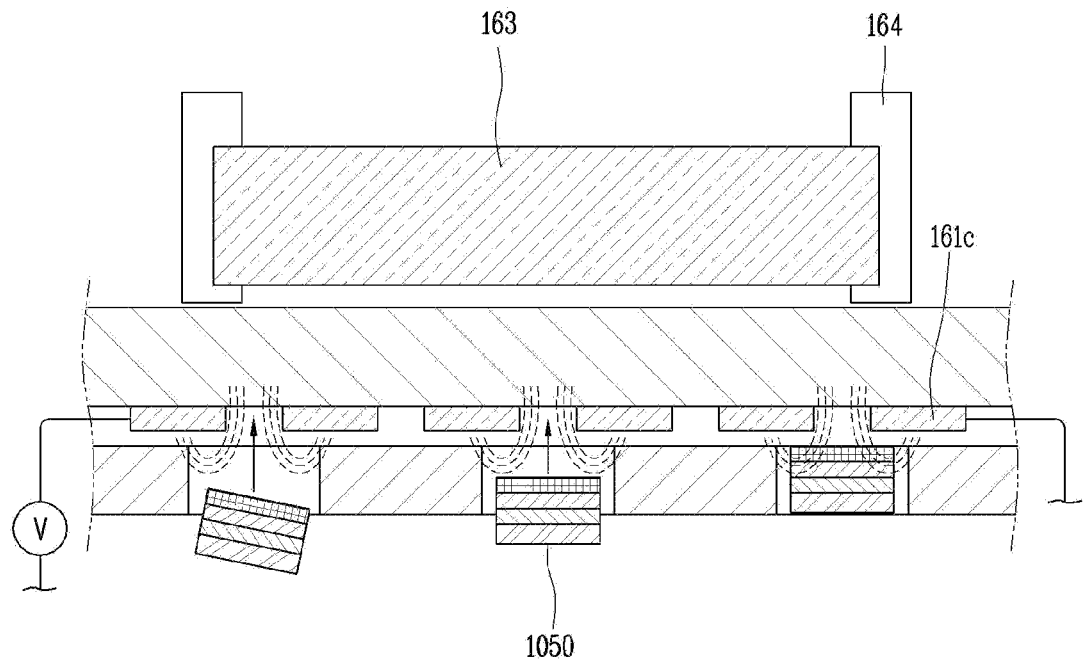

[FIG. 8e]
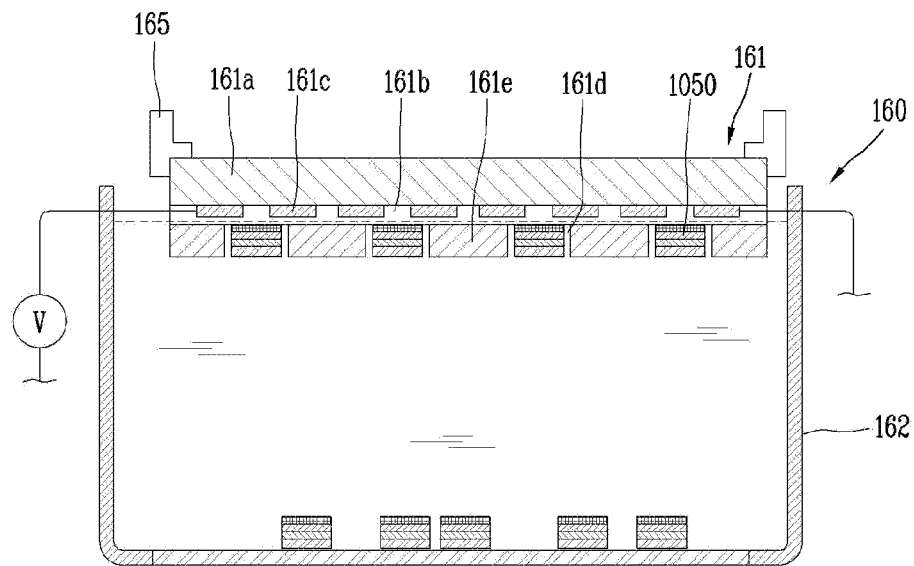
[FIG. 9]
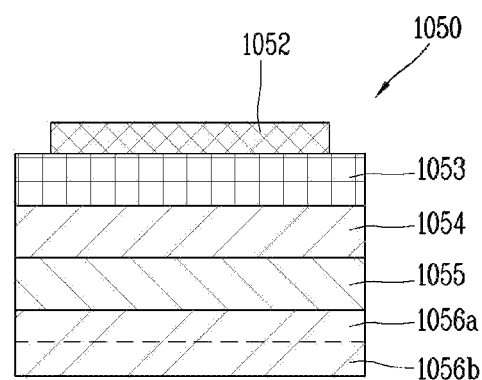

[FIG. 10a]
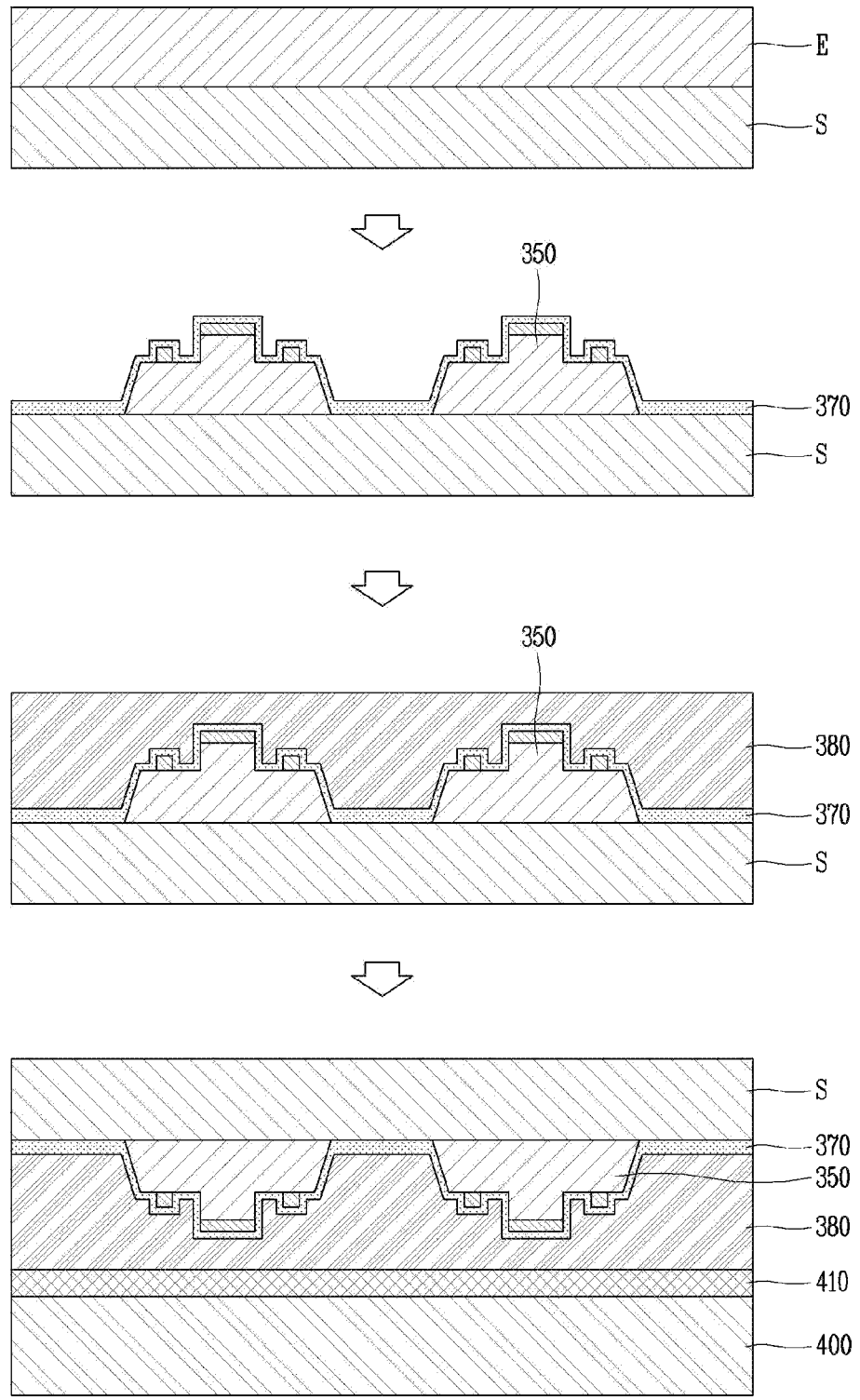

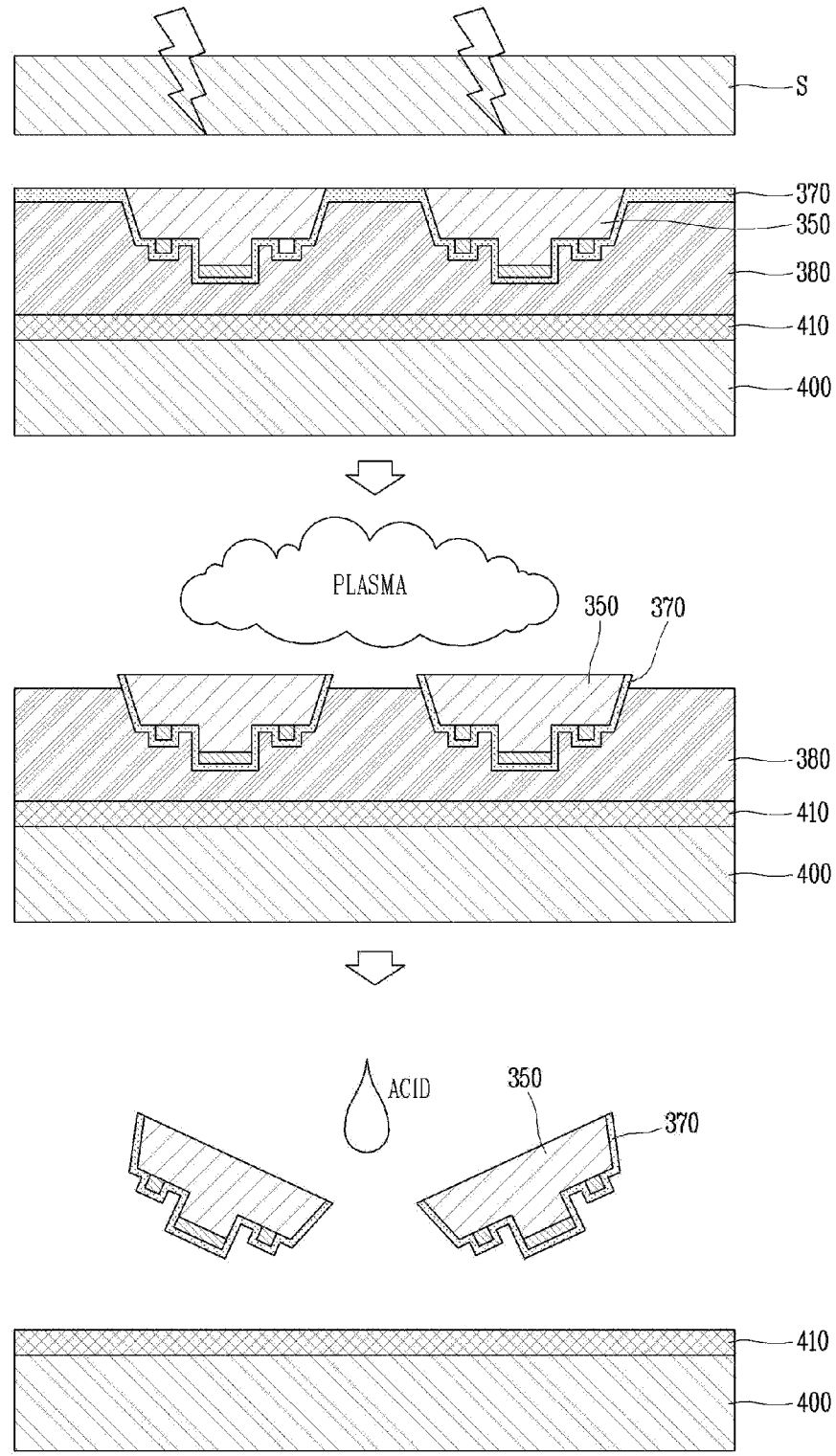
[FIG. 10b]

[FIG. 11a]
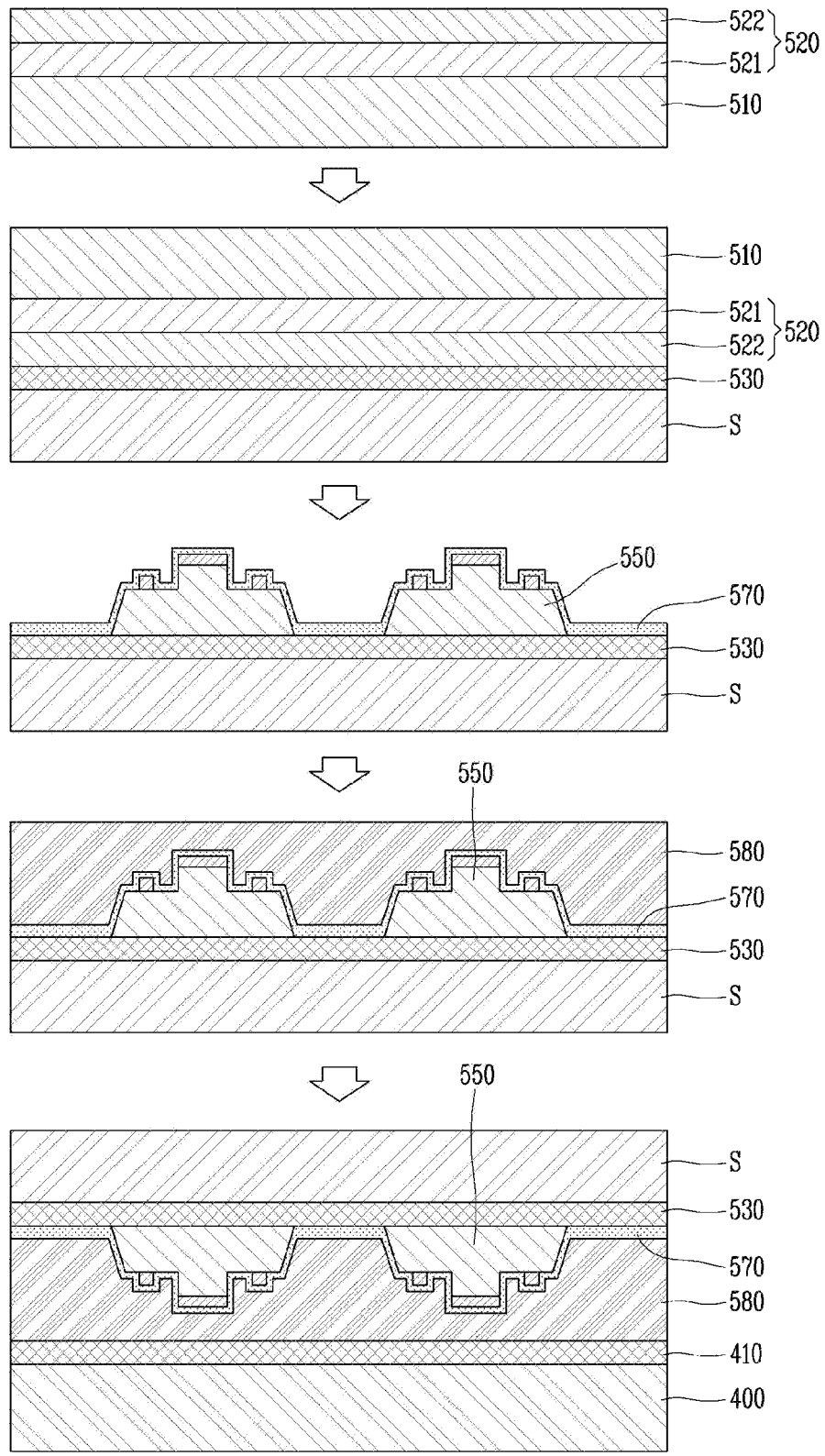

[FIG. 11b]
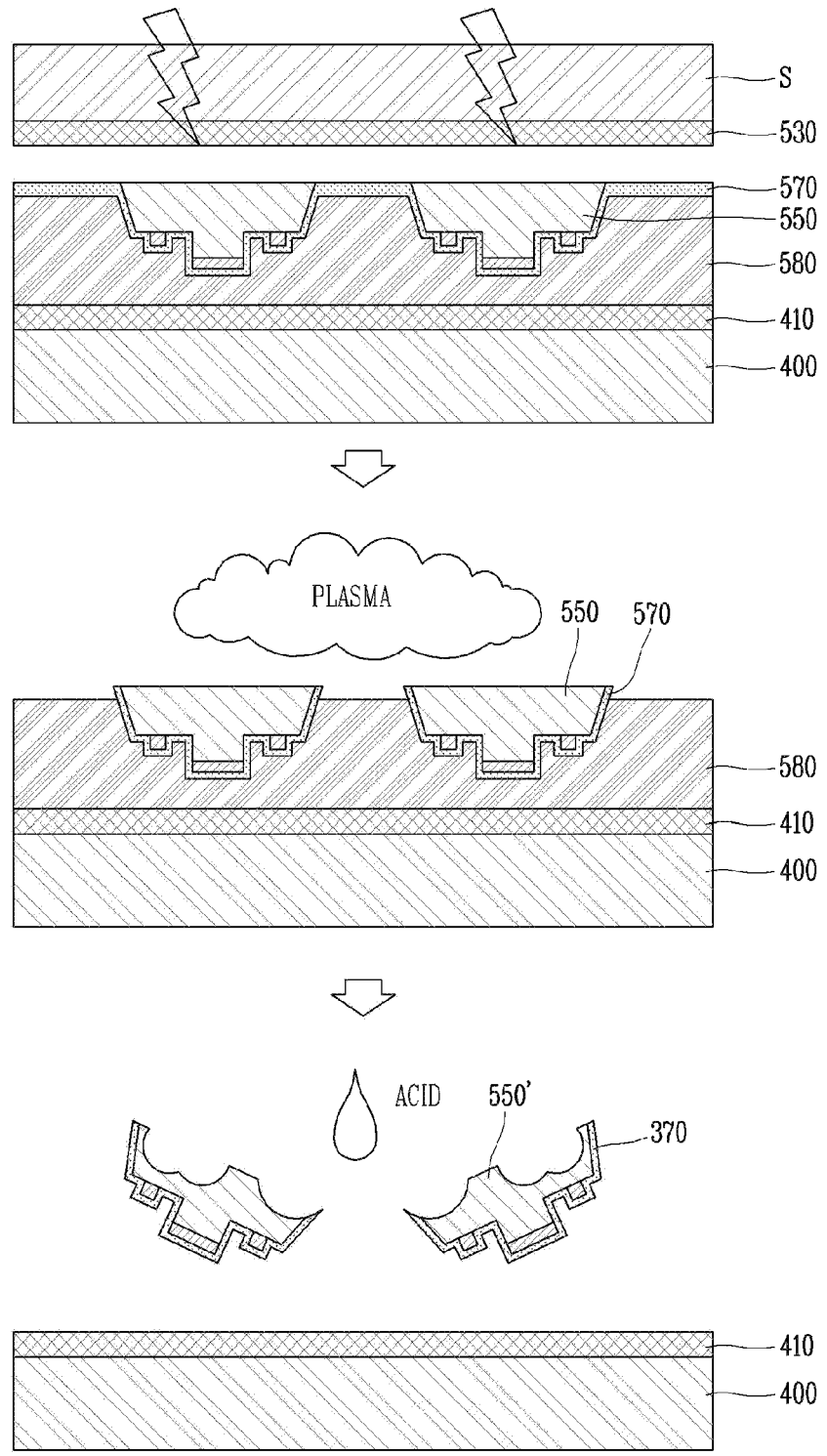

[FIG. 12a]
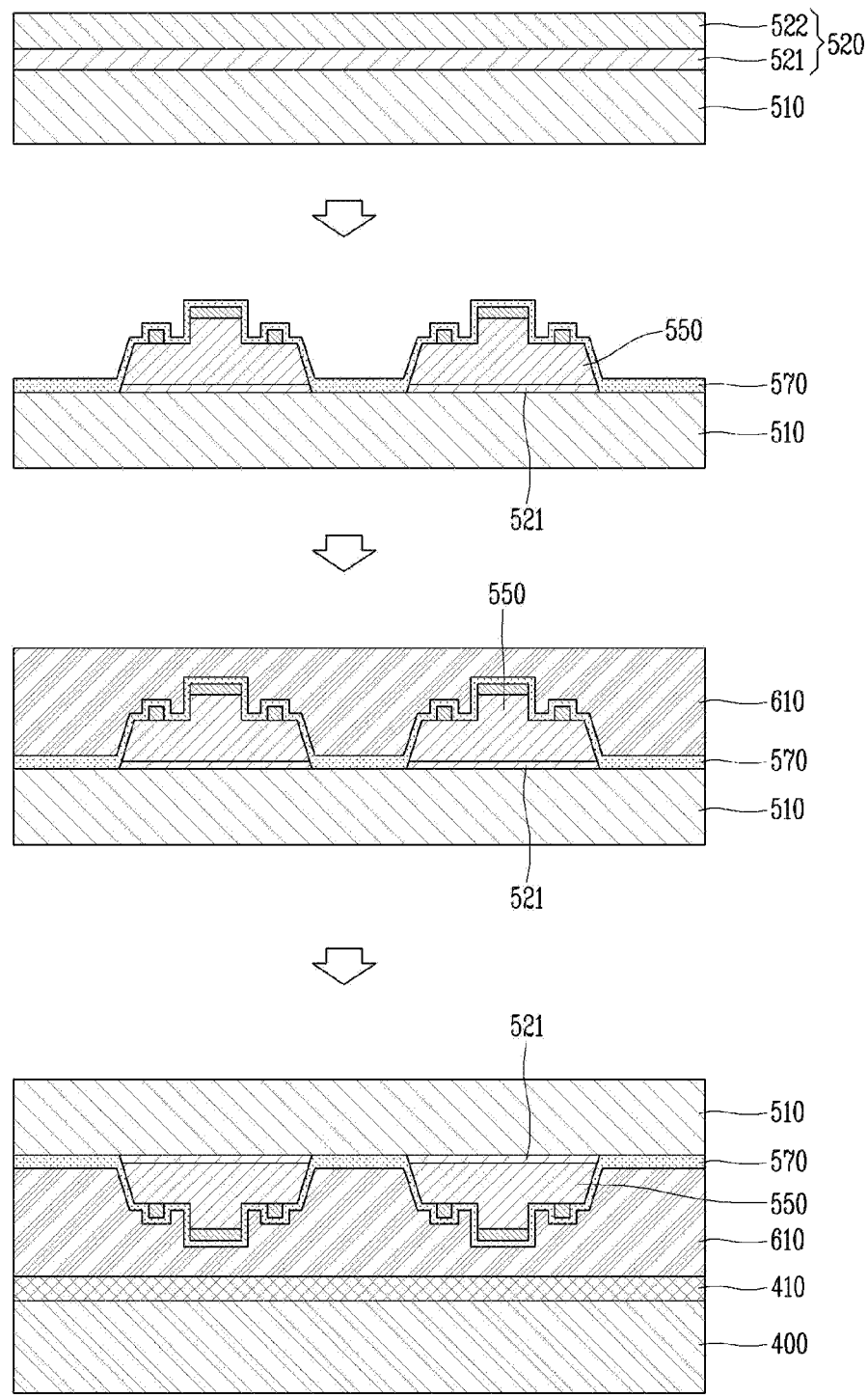

[FIG. 12b]
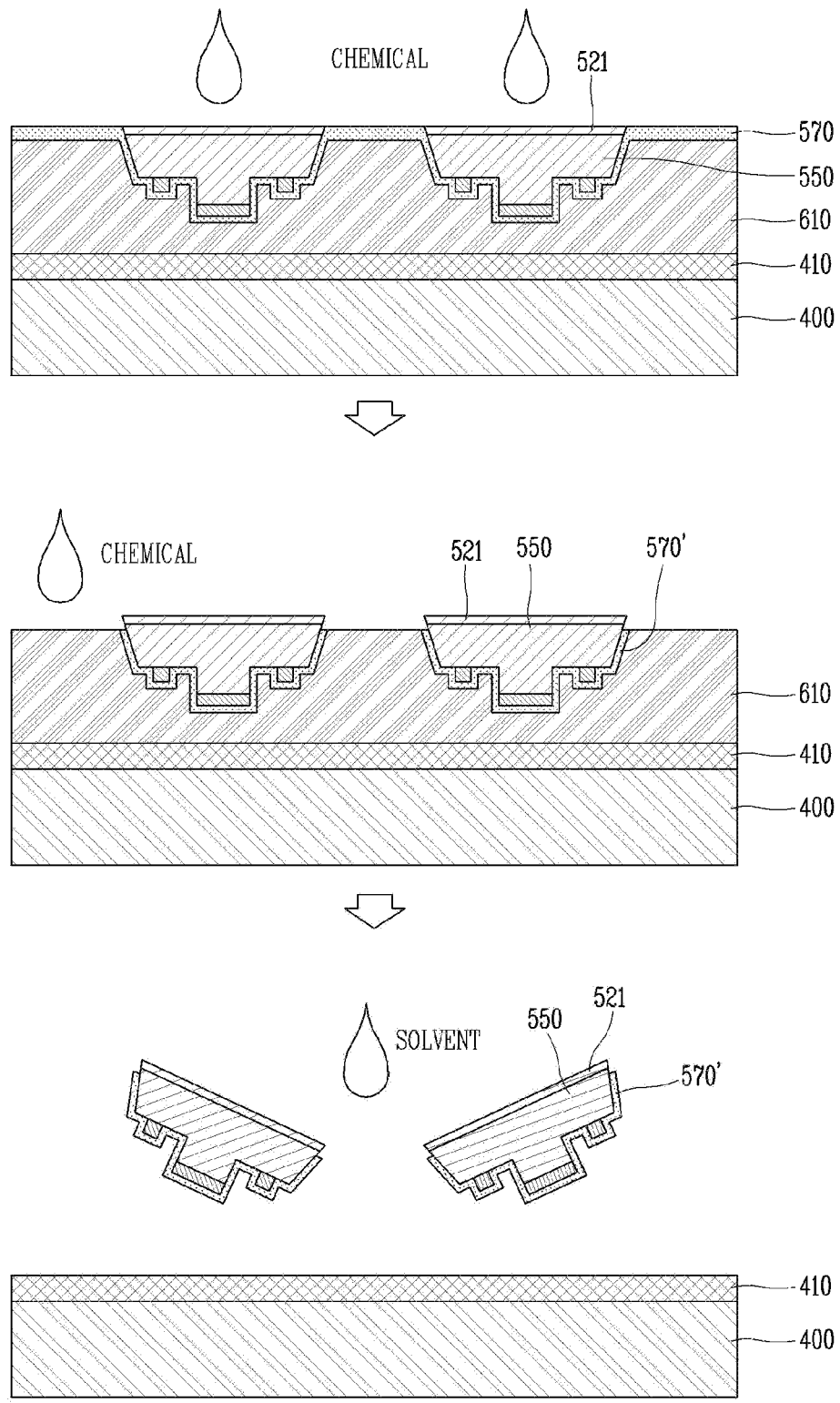

[FIG. 13]
(a) 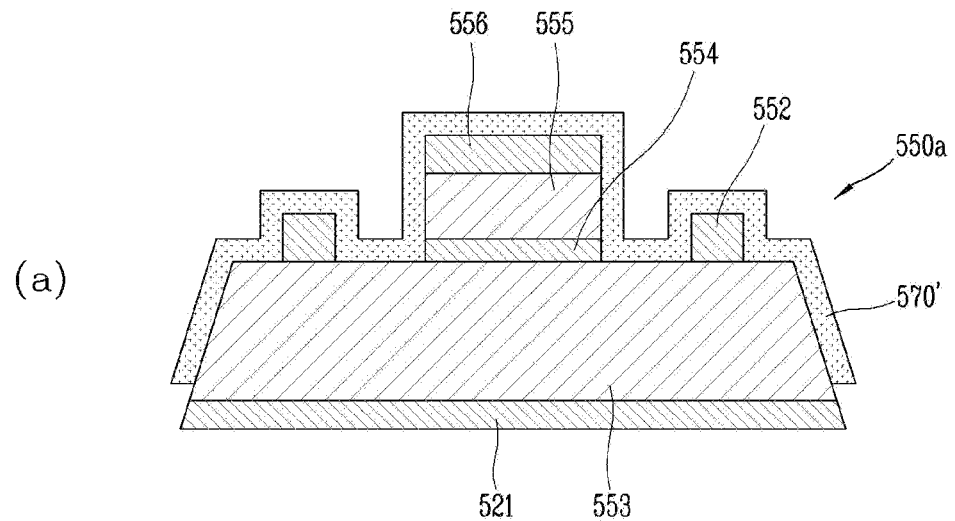
(b) 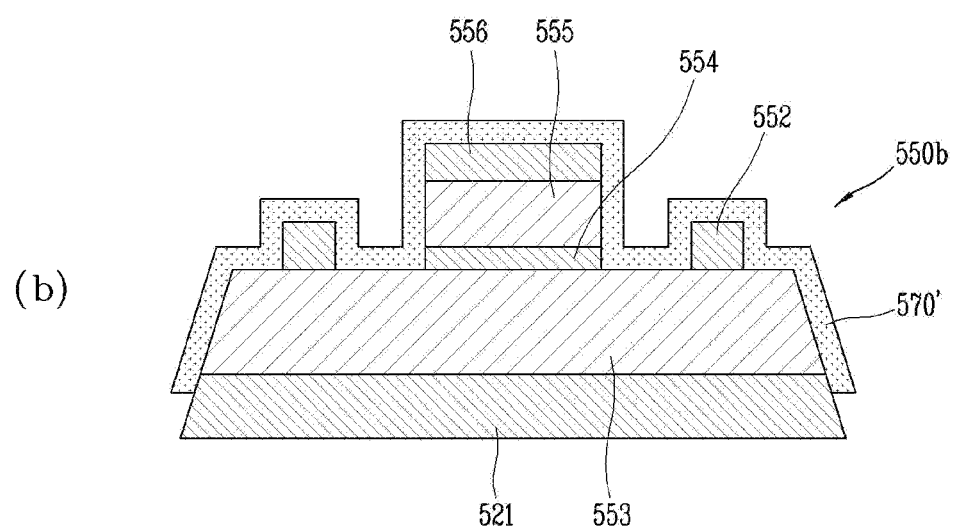

[FIG. 14]
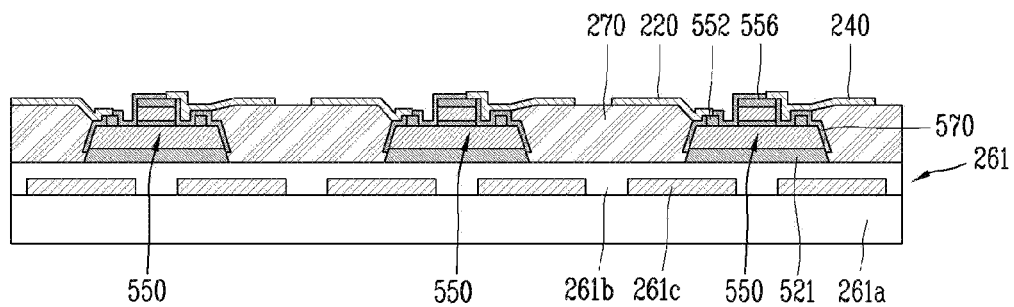

DISPLAY DEVICE USING SEMICONDUCTOR LIGHT EMITTING ELEMENTS, AND METHOD FOR MANUFACTURING SAME

CROSS REFERENCE TO RELATED APPLICATIONS

This application is the National Stage filing under 35 U.S.C. 371 of International Application No. PCT/KR2020/001889, filed on Feb. 11, 2020, which claims the benefit of earlier filing date and right of priority to Korean Application No. 10-2019-0157439, filed on Nov. 29, 2019, the contents of all these applications are hereby incorporated by reference herein in their entirety.

TECHNICAL FIELD

The present invention relates to a display device and a method for manufacturing the same, and more particularly, to a display device using a semiconductor light emitting device having a size of several μm to several tens of μm, and a method for manufacturing the same.

BACKGROUND ART

Recently, liquid crystal displays (LCD), organic light emitting device (OLED) displays, and micro LED displays are competing to implement large-area displays in the display technology field.

On the other hand, when a semiconductor light emitting device having a diameter or cross-sectional area of 100 μm or less(micro LED) is used for a display, a very high efficiency can be provided because the display does not absorb light using a polarizing plate or the like. However, since a large display requires millions of semiconductor light emitting devices, it is difficult to transfer the devices compared to other technologies.

The technologies currently being developed for the transfer process include a pick and place method, a laser lift-off (LLO) method, or a self-assembly method. Among them, the self-assembly method is a method in which the semiconductor light emitting device finds its own position in a fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of micro LED is still insufficient. Accordingly, the present invention proposes a new type of manufacturing method in which the micro LED can be self-assembled.

DISCLOSURE

Technical Problem

An object of the present invention is to provide a new manufacturing process having high reliability in a large-screen display using a micro-sized semiconductor light emitting device.

Another object of the present invention is to provide a manufacturing process capable of improving transfer precision when self-assembling a semiconductor light emitting device into an assembly substrate.

Another object of the present invention is to provide a manufacturing method capable of manufacturing a red semiconductor light emitting device used for self-assembly without damage.

Technical Solution

In order to achieve the above object, the present invention includes a substrate including a wiring electrode, a plurality of semiconductor light emitting devices electrically connected to the wiring electrode, and a passivation layer formed to cover the semiconductor light emitting devices, and is characterized in that the passivation layer is formed to cover only a portion of the side surface of the semiconductor light emitting devices.

In an embodiment, the passivation layer can be formed along a side surface of the semiconductor light emitting devices from a predetermined height or higher with respect to one surface of the substrate in contact with the semiconductor light emitting devices.

In an embodiment, the semiconductor light emitting device can include an etching stop layer disposed in contact with the substrate and a plurality of conductivity type semiconductor layers formed on the etching stop layer.

In an embodiment, the passivation layer can be formed on a side surface of the conductivity type semiconductor layer stacked on the etching stop layer, and can be formed along a side surface of the semiconductor light emitting devices in a direction away from the substrate.

In an embodiment, the passivation layer can be formed to cover a portion of a side surface of the etching stop layer, and can be formed along a side surface of the semiconductor light emitting devices in a direction away from the substrate.

In an embodiment, the plurality of semiconductor light emitting devices can include three types semiconductor light emitting devices having different center wavelengths, the passivation layer can be formed to cover only a portion of a side surface of the semiconductor light emitting devices having the largest central wavelength value among the three types of semiconductor light emitting devices.

In an embodiment, the passivation layer can be formed to cover the entire side surface of the other semiconductor light emitting devices except for the semiconductor light emitting device having the largest central wavelength value among the three types of semiconductor light emitting devices.

Also, the present invention provide a method of manufacturing a display device, characterized in that it includes a step of sequentially stacking an etching stop layer and a conductivity type semiconductor layer on a growth substrate, a step of etching the etching stop layer and the conductivity type semiconductor layer to form a plurality of semiconductor light emitting devices, a step of forming a passivation layer on the semiconductor light emitting device, a step of forming a sacrificial layer on the passivation layer, a step of etching the growth substrate, a step of etching the passivation layer and etching the sacrificial layer. And the step of etching of the passivation layer is performed to etch a portion of the passivation layer covering the side surface of the semiconductor light emitting device.

In an embodiment, the etching stop layer can be made of GaInP, and the conductivity type semiconductor layer can be made of at least one of AlGaInP or AlInP.

In an embodiment, etching the growth substrate, etching the passivation layer, and etching the sacrificial layer can be performed by wet etching.

Advantageous Effects

According to the present invention having the above configuration, in a display device in which individual pixels are formed of micro light emitting diodes, a large number of semiconductor light emitting devices can be assembled at once.

As described above, according to the present invention, it is possible to pixelate a large amount of semiconductor light emitting devices on a small-sized wafer and then transfer them to a large-area substrate. Through this, it is possible to manufacture a large-area display device at a low cost.

In addition, according to the manufacturing method of the present invention, by using magnetic and electric fields in solution to simultaneously transfer semiconductor light emitting devices in place, it is possible to implement low-cost, high-efficiency, and high-speed transfer regardless of the size, number, or transfer area of parts.

Furthermore, since it is assembled by an electric field, selective assembly is possible through selective electrical application without a separate additional device or process. Also, by arranging the assembly substrate on the upper side of the chamber, loading and unloading of the substrate can be facilitated, and non-specific binding of the semiconductor light emitting device can be prevented.

Further, according to the present invention, since the hydrochloric acid-based solution is not used until the red semiconductor light emitting device is manufactured and then dispersed in the fluid, it is possible to prevent the red semiconductor light emitting device from being damaged.

In addition, according to the present invention, since there is no lift-off process using a laser when manufacturing the red semiconductor light emitting device, it is possible to significantly lower the probability of breakage of the red semiconductor light emitting device.

DESCRIPTION OF DRAWINGS

FIG. 1 is a conceptual diagram showing an embodiment of a display device using a semiconductor light emitting device of the present invention.

FIG. 2 is a partially enlarged view of part A of the display device of FIG. 1.

FIG. 3 is an enlarged view of the semiconductor light emitting device of FIG. 2.

FIG. 4 is an enlarged view showing another embodiment of the semiconductor light emitting device of FIG. 2.

FIGS. 5A to 5E are conceptual views for explaining a new process of manufacturing the above-described semiconductor light emitting device.

FIG. 6 is a conceptual diagram illustrating an example of a self-assembly device for a semiconductor light emitting device according to the present invention.

FIG. 7 is a block diagram of the self-assembly device of FIG. 6.

FIGS. 8A to 8E are conceptual views illustrating a process of self-assembling a semiconductor light emitting device using the self-assembly device of FIG. 6.

FIG. 9 is a conceptual diagram for explaining the semiconductor light emitting device of FIGS. 8A to 8E.

FIGS. 10A and 10B are conceptual views illustrating a method of manufacturing a blue and green semiconductor light emitting device.

FIGS. 11A and 11B are conceptual views illustrating problems occurring when the manufacturing method described with reference to FIGS. 10A and 10B is used for manufacturing a red semiconductor light emitting device.

FIGS. 12A and 12B are conceptual views illustrating a method of manufacturing a semiconductor light emitting device according to the present invention.

FIG. 13 is a cross-sectional view of a semiconductor light emitting device manufactured by a manufacturing method according to an embodiment of the present invention.

FIG. 14 is a cross-sectional view of a display device using a semiconductor light emitting device according to the present invention.

MODE FOR INVENTION

Hereinafter, the embodiments disclosed in the present specification will be described in detail with reference to the attached drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies can obscure the gist of the embodiments disclosed in the present specification, the detailed description thereof will be omitted. In addition, the attached drawings are only for easy understanding of the embodiments disclosed in the present specification, and should not be construed as limiting the technical idea disclosed herein by the attached drawings.

Also, when an element such as a layer, region or substrate is referred to as being "on" another component, it will be understood that this can be directly on other elements or intervening elements can exist in between.

A display device described in this specification can include a mobile phone, a smart phone, a laptop computer, a digital broadcasting terminal, a personal digital assistant (PDA), a portable multimedia player (PMP), a navigation system, a slate PC, a Tablet PC, an Ultra Book, a digital TV, a digital signage, a head mounted display (HMD), a desktop computer, and the like. However, it will be readily apparent to those skilled in the art that the configuration according to the embodiment described herein can be applied to a display capable device even in a new product form to be developed later.

FIG. 1 is a conceptual diagram showing an embodiment of a display device using a semiconductor light emitting device of the present invention, FIG. 2 is a partial enlarged view of part A of the display device of FIG. 1, FIG. 3 is an enlarged view of the semiconductor light emitting device of FIG. 2; FIG. 4 is an enlarged view illustrating another embodiment of the semiconductor light emitting device of FIG. 2.

As illustrated, information processed by the control unit of the display device 100 can be output from the display module 140. A closed-loop case 101 surrounding an edge of the display module can form a bezel of the display device.

The display module 140 can include a panel 141 on which an image is displayed, the panel 141 can include a micro-sized semiconductor light emitting device 150 and a wiring substrate 110 on which the semiconductor light emitting device 150 is mounted.

A wiring can be formed on the wiring substrate 110 to be connected to the n-type electrode 152 and the p-type electrode 156 of the semiconductor light emitting device 150. Through this, the semiconductor light emitting device 150 can be provided on the wiring substrate 110 as an individual pixel that emits light.

The image displayed on the panel 141 is visual information, and is implemented by independently controlling the light emission of sub-pixels arranged in a matrix form through the wiring.

In the present invention, a micro LED (Light Emitting Diode) is exemplified as a type of the semiconductor light emitting device 150 that converts current into light. The micro LED can be a light emitting diode formed in a small size of 100 micrometers or less. In the semiconductor light emitting device 150, blue, red, and green colors are respectively provided in the light emitting region, and a unit pixel can be implemented by a combination thereof. That is, the unit pixel means a minimum unit for implementing one color, and at least three micro LEDs can be provided in the unit pixel.

More specifically, referring to FIG. 3, the semiconductor light emitting device 150 can have a vertical structure.

For example, the semiconductor light-emitting device 150 can be implemented as a high-output light-emitting device that emits various types of light, including blue, by mainly using gallium nitride (GaN) and adding indium (In) and/or aluminum (Al) together.

Such a vertical semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 can be electrically connected to the p-electrode of the wiring substrate, and the upper n-type electrode 152 can be electrically connected to the n-electrode at the upper side of the semiconductor light emitting device. The vertical semiconductor light emitting device 150 has a great advantage in that it is possible to reduce the chip size because electrodes can be arranged up and down.

As another example, referring to FIG. 4, the semiconductor light emitting device can be a flip chip type light emitting device.

As an example, the semiconductor light emitting device 250 includes a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 can be electrically connected to the p-electrode and the n-electrode of the wiring substrate under the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. In the case of a green semiconductor light emitting device and a blue semiconductor light emitting device, gallium nitride (GaN) is mainly used, and indium (In) and/or aluminum (Al) are added together, so that it can be implemented as a high-output light emitting device emitting green or blue light. For this example, the semiconductor light emitting device can be a gallium nitride thin film formed in various layers such as n-Gan, p-Gan, AlGaN, InGan, etc. Specifically, the p-type semiconductor layer can be P-type GaN, and the n-type semiconductor layer can be N-type GaN. However, in the case of a red semiconductor light emitting device, the p-type semiconductor layer can be P-type GaAs, and the n-type semiconductor layer can be N-type GaAs.

Also, the p-type semiconductor layer can be P-type GaN doped with Mg on the p-electrode side, and the n-type semiconductor layer can be N-type GaN doped with Si on the n-electrode side. In this case, the above-described semiconductor light emitting devices can be semiconductor light emitting devices without an active layer.

On the other hand, referring to FIGS. 1 to 4, since the light emitting diode is very small, in the display panel, self-luminous unit pixels can be arranged in a high definition, through this, a high-definition display device can be implemented.

In the display device using the semiconductor light emitting device of the present invention described above, the semiconductor light emitting device grown on a wafer and formed through mesa and isolation is used as an individual pixel. In this case, the micro-sized semiconductor light emitting device 150 should be transferred to a pre-set position on the substrate of the display panel on the wafer. There is a pick and place method as such a transfer technology, but the success rate is low and a lot of time is required. As another example, there is a technique of transferring several devices at once using a stamp or a roll, but there is a limit to the yield, which is not suitable for a large screen display. The present invention proposes a new manufacturing method and manufacturing device of a display device that can solve these problems.

To this end, hereinafter, anew method of manufacturing a display device will be described. FIGS. 5A to 5E are conceptual views for explaining a new process of manufacturing the above-described semiconductor light emitting device.

In this specification, a display device using a passive matrix (PM) type semiconductor light emitting device is exemplified. However, the examples described below are also applicable to an active matrix (AM) type semiconductor light emitting device. In addition, although a method of self-assembly a horizontal semiconductor light emitting device is exemplified, it is also applicable to a method of self-assembly a vertical semiconductor light emitting device.

First, according to the manufacturing method, the first conductivity type semiconductor layer 153, the active layer 154, and the second conductivity type semiconductor layer 155 are grown on the growth substrate 159, respectively (refer to FIG. 5A).

When the first conductivity type semiconductor layer 153 is grown, next, an active layer 154 is grown on the first conductivity type semiconductor layer 153, next, a second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154, and the second conductivity type semiconductor layer 155 form a stacked structure.

In this case, the first conductivity type semiconductor layer 153 can be a p-type semiconductor layer, and the second conductivity type semiconductor layer 155 can be an n-type semiconductor layer. However, the present invention is not necessarily limited thereto, and examples in which the first conductivity type is n-type and the second conductivity type is p-type are also possible.

In addition, although the case in which the active layer is present is exemplified in this embodiment, a structure without the active layer is possible in some cases as described above. For this example, the p-type semiconductor layer can be P-type GaN doped with Mg, and the n-type semiconductor layer can be N-type GaN doped with Si on the n-electrode side.

The growth substrate 159 (wafer) can be formed of a material having a light-transmitting property, for example, any one of sapphire (Al2O3), GaN, ZnO, and AlO, but is not limited thereto. In addition, the growth substrate 1059 can be formed of a material suitable for semiconductor material growth, a carrier wafer. Also, it can be formed of a material with excellent thermal conductivity, including a conductive substrate or an insulating substrate, for example, at least one of Si, GaAs, GaP, InP, Ga2O3 or a SiC substrate having higher thermal conductivity than a sapphire (Al2O3) substrate can be used.

Next, at least some of the first conductivity type semiconductor layer 153, the active layer 154, and the second conductivity type semiconductor layer 155 are removed to form a plurality of semiconductor light emitting devices (refer to FIG. 5B).

More specifically, isolation is performed so that a plurality of light emitting devices form a light emitting device array. That is, the first conductivity type semiconductor layer 153, the active layer 154, and the second conductivity type semiconductor layer 155 are vertically etched to form a plurality of semiconductor light emitting devices.

If a horizontal semiconductor light emitting device is formed, the active layer 154 and the second conductivity type semiconductor layer 155 are partially removed in the vertical direction, a mesa process in which the first conductivity type semiconductor layer 153 is exposed to the outside, and an isolation process in which the first conductivity type semiconductor layer is etched to form a plurality of semiconductor light emitting device arrays can be performed thereafter.

Next, second conductive electrodes 156 (or p-type electrodes) are respectively formed on one surface of the second conductivity type semiconductor layer 155 (refer to FIG. 5C). The second conductive electrode 156 can be formed by a deposition method such as sputtering, but the present invention is not limited thereto. However, when the first conductivity type semiconductor layer and the second conductivity type semiconductor layer are an n-type semiconductor layer and a p-type semiconductor layer, respectively, the second conductive electrode 156 can be an n-type electrode.

Next, the growth substrate 159 is removed to provide a plurality of semiconductor light emitting devices. For example, the growth substrate 1059 can be removed using a laser lift-off (LLO) method or a chemical lift-off (CLO) method (refer to FIG. 5D).

Thereafter, a step of settling the semiconductor light emitting devices 150 on a substrate in a chamber filled with a fluid is performed (refer to FIG. 5E).

For example, the semiconductor light emitting devices 150 and the substrate are put in a chamber filled with a fluid, and the semiconductor light emitting devices are self-assembled on the substrate 1061 using flow, gravity, surface tension, and the like. In this case, the substrate can be the assembly substrate 161.

As another example, it is also possible to put a wiring substrate in a fluid chamber instead of the assembly substrate 161 so that the semiconductor light emitting devices 150 are directly disposed on the wiring substrate. In this case, the substrate can be a wiring substrate. However, for convenience of description, in the present invention, the substrate is provided as the assembly substrate 161 to exemplify that the semiconductor light emitting devices 1050 are mounted.

Cells (not shown) in which the semiconductor light emitting devices 150 are inserted can be provided in the assembly substrate 161 to facilitate mounting of the semiconductor light emitting devices 150 on the assembly substrate 161. Specifically, cells in which the semiconductor light emitting devices 150 are disposed are formed on the assembly substrate 161 at positions where the semiconductor light emitting devices 150 are aligned with the wiring electrodes. The semiconductor light emitting devices 150 are assembled to the cells while moving in the fluid.

After arranging a plurality of semiconductor light emitting devices on the assembly substrate 161, if the semiconductor light emitting devices of the assembly substrate 161 are transferred to a wiring substrate, large-area transfer is possible. Accordingly, the assembly substrate 161 can be referred to as a temporary substrate.

On the other hand, in order to apply the self-assembly method described above to the manufacture of a large-screen display, it is necessary to increase the transfer yield. The present invention proposes a method and device for minimizing the influence of gravity or frictional force and preventing non-specific binding in order to increase the transfer yield.

In this case, in the display device according to the present invention, a magnetic material is disposed on a semiconductor light emitting device to move the semiconductor light emitting device using magnetic force, and the semiconductor light emitting device is disposed at a pre-set position by using an electric field during the movement process. Hereinafter, such a transfer method and device will be described in more detail with the attached drawings.

FIG. 6 is a conceptual diagram illustrating an example of a self-assembly device for a semiconductor light emitting device according to the present invention, and FIG. 7 is a block diagram of the self-assembly device of FIG. 6. FIGS. 8A to 8D are conceptual views illustrating a process of self-assembly a semiconductor light emitting device using the self-assembly device of FIG. 6, and FIG. 9 is a conceptual diagram for explaining the semiconductor light emitting device of FIGS. 8A to 8D.

Referring to FIGS. 6 and 7, the self-assembly device 160 of the present invention can include a fluid chamber 162, a magnet 163, and a position control unit 164.

The fluid chamber 162 has a space for accommodating a plurality of semiconductor light emitting devices. The space can be filled with a fluid, and the fluid can include water as an assembly solution. Accordingly, the fluid chamber 162 can be a water tank and can be configured as an open type. However, the present invention is not limited thereto, and the fluid chamber 162 can be of a closed type in which the space is a closed space.

In the fluid chamber 162, the substrate 161 can be disposed such that an assembly surface on which the semiconductor light emitting devices 150 are assembled faces downward. For example, the substrate 161 can be transferred to an assembly position by a transfer unit, and the transfer unit can include a stage 165 on which the substrate is mounted. The position of the stage 165 is adjusted by the controller, and through this, the substrate 161 can be transferred to the assembly position.

At this time, the assembly surface of the substrate 161 faces the bottom of the fluid chamber 150 in the assembly position. As shown, the assembly surface of the substrate 161 is arranged to be immersed in the fluid in the fluid chamber 162. Accordingly, the semiconductor light emitting device 150 moves to the assembly surface in the fluid.

The substrate 161 is an assembly substrate capable of forming the electric field, and can include a base part 161a, a dielectric layer 161b, and a plurality of electrodes 161c.

The base part 161a can be made of an insulating material, and the plurality of electrodes 161c can be thin film or thick film bi-planar electrodes patterned on one surface of the base part 161a. The electrode 161c can be formed of, for example, a stack of Ti/Cu/Ti, Ag paste, ITO, or the like.

The dielectric layer 161b can be made of an inorganic material such as $SiO_2$, $SiN_x$, SiON, $Al_2O_3$, $TiO_2$, $HfO_2$, or the like. Alternatively, the dielectric layer 161b can be formed of a single layer or a multi-layer as an organic insulator. The thickness of the dielectric layer 161b can be in the range of several tens of nm to several μm.

Furthermore, the substrate 161 according to the present invention includes a plurality of cells 161d partitioned by barrier wall. The cells 161d are sequentially arranged in one direction and can be made of a polymer material. Also, the barrier wall 161e forming the cells 161d are shared with the neighboring cells 161d. The barrier wall 161e protrudes from the base part 161a, and the cells 161d can be sequentially disposed along one direction by the barrier wall 161e. More specifically, the cells 161d can be sequentially arranged in the column and row directions, respectively, and can have a matrix structure.

Inside the cells 161d, as shown, a groove for accommodating the semiconductor light emitting device 150 is provided, and the groove can be a space defined by the barrier wall 161e. The shape of the groove can be the same as or similar to that of the semiconductor light emitting device. For example, when the semiconductor light emitting device has a rectangular shape, the groove can have a rectangular shape. Also, although not shown, when the semiconductor light emitting device has a circular shape, the grooves formed in the cells can have a circular shape. Furthermore, each of the cells is configured to accommodate a single semiconductor light emitting device. That is, one semiconductor light emitting device is accommodated in one cell.

Meanwhile, the plurality of electrodes 161c can include a plurality of electrode lines disposed at the bottom of each of the cells 161d, and the plurality of electrode lines can extend to adjacent cells.

The plurality of electrodes 161c are disposed below the cells 161d, and different polarities are applied to each other to generate an electric field in the cells 161d. To form the electric field, the dielectric layer can form the bottom of the cells 161d while covering the plurality of electrodes 161c with the dielectric layer. In this structure, when different polarities are applied to the pair of electrodes 161c under each of the cells 161d, an electric field can be formed, and the semiconductor light emitting device can be inserted into the cells 161d by the electric field.

In the assembly position, the electrodes of the substrate 161 are electrically connected to the power supply unit 171. The power supply unit 171 applies power to the plurality of electrodes to generate the electric field.

As shown, the self-assembly device can include a magnet 163 for applying a magnetic force to the semiconductor light emitting devices. The magnet 163 is spaced apart from the fluid chamber 162 to apply a magnetic force to the semiconductor light emitting devices 150. The magnet 163 can be disposed to face the opposite surface of the assembly surface of the substrate 161, and the position of the magnet is controlled by the position controller 164 connected to the magnet 163.

The semiconductor light emitting device 1050 can include a magnetic material to move in the fluid by the magnetic field of the magnet 163.

Referring to FIG. 9, in a semiconductor light emitting device including a magnetic material can include a first conductive electrode 1052 and a second conductive electrode 1056, a first conductivity type semiconductor layer 1053 on which the first conductive electrode 1052 is disposed, a second conductivity type semiconductor layer 1055 overlapping the first conductivity type semiconductor layer 1052 and on which the second conductive electrode 1056 is disposed, and an active layer 1054 disposed between the first and second conductivity type semiconductor layers 1053 and 1055.

Here, the first conductivity type can be a p-type, and the second conductivity type can be configured as an n-type, and vice versa. In addition, as described above, it can be a semiconductor light emitting device without the active layer.

Meanwhile, in the present invention, the first conductive electrode 1052 can be generated after the semiconductor light emitting device is assembled on the wiring substrate by self-assembly of the semiconductor light emitting device. Also, in the present invention, the second conductive electrode 1056 can include the magnetic material. The magnetic material can mean a magnetic metal. The magnetic material can be Ni, SmCo, or the like, and as another example, can include a material corresponding to at least one of Gd-based, La-based, or Mn-based materials.

The magnetic material can be provided on the second conductive electrode 1056 in the form of particles. Alternatively, in a conductive electrode including a magnetic material, one layer of the conductive electrode can be formed of a magnetic material. For this example, as shown in FIG. 9, the second conductive electrode 1056 of the semiconductor light emitting device 1050 can include a first layer 1056a and a second layer 1056b. Here, the first layer 1056a can include a magnetic material, and the second layer 1056b can include a metal material rather than a magnetic material.

As shown, in this example, the first layer 1056a including a magnetic material can be disposed to contact the second conductivity type semiconductor layer 1055. In this case, the first layer 1056a is disposed between the second layer 1056b and the second conductivity type semiconductor layer 1055. The second layer 1056b can be a contact metal connected to the second electrode of the wiring substrate. However, the present invention is not necessarily limited thereto, and the magnetic material can be disposed on one surface of the first conductivity type semiconductor layer.

Referring back to FIGS. 6 and 7, more specifically, the self-assembly device can include a magnet handler capable of automatically or manually moving the x, y, and z axes on the upper portion of the fluid chamber, or a motor capable of rotating the magnet 163. The magnet handler and the motor can constitute the position control unit 164. Through this, the magnet 163 rotates in a horizontal direction, clockwise or counterclockwise direction with the substrate 161.

Meanwhile, a light-transmitting bottom plate 166 can be formed in the fluid chamber 162, and the semiconductor light emitting devices can be disposed between the bottom plate 166 and the substrate 161. An image sensor 167 can be disposed to face the bottom plate 166 to monitor the inside of the fluid chamber 162 through the bottom plate 166. The image sensor 167 is controlled by the controller 172 and can include an inverted type lens and a CCD to observe the assembly surface of the substrate 161.

The self-assembly device described above can be made to use a combination of a magnetic field and an electric field. Using this, the semiconductor light emitting devices can be mounted at a pre-set position on the substrate by the electric field while the semiconductor light emitting devices are moved by a change in the position of the magnet. Hereinafter, the assembly process using the self-assembly device described above will be described in more detail.

First, a plurality of semiconductor light emitting devices 1050 including a magnetic material are formed through the process described with reference to FIGS. 5A to 5C. In this case, in the process of forming the second conductive electrode of FIG. 5C, a magnetic material can be deposited on the semiconductor light emitting device.

Next, the substrate 161 is transferred to the assembly position, and the semiconductor light emitting devices 1050 are put into the fluid chamber 162 (refer to FIG. 8A).

As described above, the assembly position of the substrate 161 can be a position in which the assembly surface of the substrate 161 on which the semiconductor light emitting devices 1050 are assembled faces downward in the fluid chamber 162.

In this case, some of the semiconductor light emitting devices 1050 can sink to the bottom of the fluid chamber 162 and some can float in the fluid. When the light-transmitting bottom plate 166 is provided in the fluid chamber 162, some of the semiconductor light emitting devices 1050 can sink to the bottom plate 166.

Next, a magnetic force is applied to the semiconductor light emitting devices 1050 so that the semiconductor light emitting devices 1050 vertically float in the fluid chamber 162 (refer to FIG. 8B).

When the magnet 163 of the self-assembly device moves from its original position to the opposite surface of the assembly surface of the substrate 161, the semiconductor light emitting devices 1050 are raised in the fluid toward the substrate 161. The original position can be a position deviated from the fluid chamber 162. As another example, the magnet 163 can be configured as an electromagnet. In this case, electricity is supplied to the electromagnet to generate an initial magnetic force.

Meanwhile, in this example, if the magnitude of the magnetic force is adjusted, the separation distance between the assembly surface of the substrate 161 and the semiconductor light emitting devices 1050 can be controlled. For example, the separation distance is controlled using the weight, buoyancy, and magnetic force of the semiconductor light emitting devices 1050. The separation distance can be several millimeters to several tens of micrometers from the outermost surface of the substrate.

Next, a magnetic force is applied to the semiconductor light emitting devices 1050 so that the semiconductor light emitting devices 1050 move in one direction in the fluid chamber 162. For example, the magnet 163 moves in a direction parallel to the substrate, clockwise or counter-clockwise (refer to FIG. 8C). In this case, the semiconductor light emitting devices 1050 move in a direction parallel to the substrate 161 at a position spaced apart from the substrate 161 by the magnetic force.

Next, in the process of moving the semiconductor light emitting devices 1050, a step of inducing the semiconductor light emitting devices 1050 to the pre-set position by applying an electric field so as to be disposed at a pre-set position of the substrate 161 is performed (refer to FIG. 8C). For example, while the semiconductor light emitting devices 1050 are moving in a direction horizontal to the substrate 161, and he semiconductor light emitting devices 1050 move in a direction perpendicular to the substrate 161 by the electric field and are disposed at a pre-set position on the substrate 161.

More specifically, power is supplied to the bi-planar electrode of the substrate 161 to generate an electric field, and by using this, assembly is induced only at a pre-set position. That is, by using the selectively generated electric field, the semiconductor light emitting devices 1050 are self-assembled at the assembly position of the substrate 161. To this end, cells in which the semiconductor light emitting devices 1050 are inserted can be provided on the substrate 161.

Thereafter, the unloading process of the substrate 161 proceeds, and the assembly process is completed. When the substrate 161 is an assembly substrate, a post-process for realizing a display device by transferring the semiconductor light emitting devices arranged as described above to a wiring substrate can be performed.

Meanwhile, after guiding the semiconductor light emitting devices 1050 to the pre-set position, the magnet 163 can be moved in a direction away from the substrate 161 so that the semiconductor light emitting devices 1050 remaining in the fluid chamber 162 fall to the bottom of the fluid chamber (refer to FIG. 8D). As another example, when power supply is stopped when the magnet 163 is an electromagnet, the semiconductor light emitting devices 1050 remaining in the fluid chamber 162 fall to the bottom of the fluid chamber 162.

Thereafter, when the semiconductor light emitting devices 1050 at the bottom of the fluid chamber 162 are recovered, the recovered semiconductor light emitting devices 1050 can be reused.

In order to increase assembly yield in fluidic assembly, the self-assembly device and method described uses a magnetic field to focus distant components near a preset assembly site, and applies a separate electric field to the assembly site to selectively assemble components only at the assembly site. At this time, the assembly substrate is placed on the upper part of the water tank and the assembly surface is directed downward to minimize the effect of gravity due to the weight of the parts and prevent non-specific binding to eliminate defects. That is, to increase the transfer yield, the assembly substrate is placed on the upper part to minimize the influence of gravity or frictional force, and non-specific binding is prevented.

As described above, according to the present invention having the above configuration, in a display device in which individual pixels are formed of semiconductor light emitting devices, a large number of semiconductor light emitting devices can be assembled at once.

As described above, according to the present invention, it is possible to pixelate a large amount of semiconductor light emitting devices on a small-sized wafer and then transfer them to a large-area substrate. Through this, it is possible to manufacture a large-area display device at a low cost.

Meanwhile, through the self-assembly method described above, a display device including semiconductor light emitting devices that emit light of different colors can be manufactured. In this case, the display device can include blue, green, and red semiconductor light emitting devices.

Here, the blue and green semiconductor light emitting devices and the red semiconductor light emitting devices have different base materials constituting the conductivity type semiconductor layer. Accordingly, the manufacturing method of the blue and green semiconductor light emitting device and the manufacturing method of the red semiconductor light emitting device are different.

When the manufacturing method of the blue and green semiconductor light emitting device is directly applied to the red semiconductor light emitting device, there is a problem in that the red semiconductor light emitting device is destroyed during the manufacturing process. More specifically, with reference to the attached drawings, a method for manufacturing blue and green semiconductor light emitting devices and problems occurring when the manufacturing method is applied to a red semiconductor light emitting device will be described.

A method for manufacturing blue and green semiconductor light emitting devices will be described.

FIGS. 10A and 10B are conceptual views illustrating a method of manufacturing a blue and green semiconductor light emitting device.

First, the step of forming the epitaxial layer (E) on the growth substrate (S) proceeds. Here, the growth substrate S can be a sapphire substrate. Meanwhile, the epitaxial layer (E) is a layer including a first conductivity type semiconductor layer, an active layer, and a second conductivity type semiconductor layer.

Thereafter, the step of forming the individual semiconductor light emitting device 350 on the growth substrate S through the isolation process and the mesa process is performed. Since this process uses a known method, a detailed description thereof will be omitted.

Next, a step of forming a passivation layer 370 on the semiconductor light emitting device 350 is performed. The material constituting the passivation layer 370 can include a dielectric material or a metal oxide material. For example, the passivation layer 370 can be formed of any one of SiO2, SiOx, SiNx, ZnO, Al2O3, WOx, MoOx, TiO2, NiO, CuOx, or HfOx.

Meanwhile, in this process, the passivation layer 370 is also formed on one surface of the growth substrate S on which the semiconductor light emitting device 350 is not formed. Thereafter, the passivation layer 370 in the region where the semiconductor light emitting device is not formed is removed. This will be described later.

Next, a step of forming a metal sacrificial layer 380 on the passivation layer 370 is performed. When the semiconductor light emitting device 350 is separated from the growth substrate S by a later lift-off process, the metal sacrificial layer 380 serves to protect the semiconductor light emitting device 350 and to facilitate fluid dispersion of the semiconductor light emitting device 350.

In an embodiment, the metal sacrificial layer 380 can be made of aluminum.

Next, a step of adhering the metal sacrificial layer 380 to the temporary substrate 400 on which the adhesive layer 410 is laminated is performed. The temporary substrate 400 can be a film-type flexible substrate or a wafer-type non-flexible substrate, but the material constituting the temporary substrate 400 is not specifically limited. Meanwhile, the adhesive layer 410 can be formed of any adhesive material to which the metal sacrificial layer 380 can be attached.

Next, the step of separating the semiconductor light emitting device 350 from the growth substrate (S) proceeds. For example, the growth substrate S can be removed using a laser lift-off (LLO) method.

Thereafter, a step of removing the passivation layer 370 formed on the growth substrate S through etching is performed. Here, the etching process can be performed through dry etching, and the passivation layer formed on the surface of the semiconductor light emitting device can remain through masking. That is, even after the etching step, the entire side surface of the semiconductor light emitting device 350 is covered with the passivation layer 370.

Finally, a step of dissolving the metal sacrificial layer 380 through wet etching and dispersing the semiconductor light emitting devices 350 in a fluid is performed. Here, the wet etching can be performed in an acidic solution capable of dissolving the metal sacrificial layer 380. For example, when the metal sacrificial layer 380 is made of aluminum, the wet etching can be performed in a hydrochloric acid-based mixed reagent. However, the etchant can vary depending on the type of the metal sacrificial layer 380.

According to the method described above, the blue and green semiconductor light emitting devices can be dispersed in a solution phase and used for self-assembly.

Next, problems occurring when the above-described method is used for manufacturing a red semiconductor light emitting device will be described.

FIGS. 11A and 11B are conceptual views illustrating problems occurring when the manufacturing method described with reference to FIGS. 10A and 10B is used to manufacture a red semiconductor light emitting device.

First, the step of forming the epitaxial layer 520 on the growth substrate 510 is performed. Here, the growth substrate for manufacturing the red semiconductor light emitting device can be made of GaAs, unlike the blue and green semiconductor light emitting devices.

Here, the epitaxial layer 520 for manufacturing a red semiconductor light emitting device can include an etching stop layer 521, a conductivity type semiconductor layer, and an active layer 522.

Specifically, the step of etching the GaAs substrate during the manufacturing process of the red semiconductor light emitting device proceeds, in order to prevent the conductivity type semiconductor layer and the active layer from being etched during the etching process, an etching stop layer 521 is stacked on the GaAs substrate. For example, the etching stop layer 521 can be made of GaInP.

A plurality of conductivity type semiconductor layers and an active layer 522 are stacked on the etching stop layer 521. The conductivity type semiconductor layer and the active layer 522 are made of III-V compound semiconductor, and among them, a material such as AlGaInP or AlInP can constitute the conductivity type semiconductor layer and the active layer. The conductivity type semiconductor layer and the active layer 522 are made of a material different from that of the etching stop layer 521.

The epitaxial layer 520 is adhered to the sapphire substrate through the resin adhesive layer 530. Accordingly, one surface of the epitaxial layer is in contact with the sapphire substrate, and the other surface of the epitaxial layer is in contact with the GaAs substrate.

Thereafter, the GaAs substrate is etched, and an individual semiconductor light emitting device is formed on the sapphire substrate through an isolation process and a mesa process. Since this process uses a known method, a detailed description thereof will be omitted.

Next, a step of forming a passivation layer 570 on the semiconductor light emitting device is performed. The material constituting the passivation layer 570 can include a dielectric material or a metal oxide material. For example, the passivation layer 570 can be formed of any one of SiO2, SiOx, SiNx, ZnO, Al2O3, WOx, MoOx, TiO2, NiO, CuOx, or HfOx.

Meanwhile, in this process, a passivation layer 570 is also formed on one surface of the growth substrate on which the semiconductor light emitting device 550 is not formed.

Next, a step of forming the metal sacrificial layer 580 on the passivation layer 570 is performed. In an embodiment, the metal sacrificial layer 580 can be made of aluminum.

Next, the step of adhering the metal sacrificial layer 580 to the temporary substrate 400 on which the adhesive layer 410 is laminated is performed. The temporary substrate 400 can be a film-type flexible substrate or a wafer-type non-flexible substrate, but the material constituting the temporary substrate 400 is not specifically limited. Meanwhile, the adhesive layer 410 can be formed of any adhesive material to which the metal sacrificial layer can be attached.

Next, a step of separating the semiconductor light emitting device 550 from the resin adhesive layer 530 is performed. For example, the resin adhesive layer 530 can be removed using a laser lift-off (LLO) method.

Thereafter, a step of removing the passivation layer 570 formed on the metal sacrificial layer 580 through etching is performed. Here, the etching process can be performed through dry etching, and through masking, the passivation layer 570 formed on the surface of the semiconductor light emitting device 550 can remain. That is, even after the etching step, the entire side surface of the semiconductor light emitting device is covered with the passivation layer 570.

Finally, a step of dissolving the metal sacrificial layer 580 through wet etching and dispersing the semiconductor light emitting devices 550 in a fluid is performed. Here, the wet etching can be performed in an acidic solution capable of dissolving the metal sacrificial layer 580.

In this etching process, the red semiconductor light emitting device 550' can be damaged. Specifically, GaInP, AlGaInP, and AlInP constituting the red semiconductor light emitting device are dissolved in an acidic solution. For this reason, the fluid dispersion method using the metal sacrificial layer 580 cannot be applied to the red semiconductor light emitting device.

The present invention provides a manufacturing method capable of dispersing a red semiconductor light emitting device in a fluid without damage. Hereinafter, the manufacturing method according to the present invention will be described in detail.

FIGS. 12A and 12B are conceptual views illustrating a method of manufacturing a semiconductor light emitting device according to the present invention.

First, a step of forming the epitaxial layer 520 on the growth substrate 510 is performed. Here, the growth substrate for manufacturing the red semiconductor light emitting device can be made of GaAs, unlike the blue and green semiconductor light emitting devices.

Here, the epitaxial layer 520 for manufacturing the red semiconductor light emitting device can include an etching stop layer 521, a conductivity type semiconductor layer, and an active layer 522.

Specifically, the step of etching the GaAs substrate during the manufacturing process of the red semiconductor light emitting device proceeds, in order to prevent the conductivity type semiconductor layer and the active layer from being etched during the etching process, an etching stop layer 521 is stacked on the GaAs substrate. For example, the etching stop layer 521 can be made of GaInP.

A plurality of conductivity type semiconductor layers and an active layer 522 are stacked on the etching stop layer 521. The conductivity type semiconductor layer and the active layer 522 are made of a III-V compound semiconductor, and among them, a material such as AlGaInP or AlInP can constitute the conductivity type semiconductor layer and the active layer 522. The conductivity type semiconductor layer and the active layer 522 are made of a material different from that of the etching stop layer 521.

Thereafter, a step of forming the individual semiconductor light emitting devices 550 on the growth substrate through the isolation process and the mesa process is performed. Since this process uses a known method, a detailed description thereof will be omitted.

Next, a step of forming a passivation layer 570 on the semiconductor light emitting device 550 is performed. The material constituting the passivation layer 570 can include a dielectric material or a metal oxide material. For example, the passivation layer 570 can be formed of any one of $SiO_2$, $SiO_x$, $SiN_x$, $ZnO$, $Al_2O_3$, $WO_x$, $MoO_x$, $TiO_2$, $NiO$, $CuO_x$, or $HfO_x$.

Next, a step of laminating a sacrificial layer 610 on the passivation layer 570 is performed. The sacrificial layer 610 is made of an organic photoresist that causes a chemical change when irradiated with light. Since the sacrificial layer 610 uses a known organic photoresist, a material constituting the sacrificial layer 610 is not specifically limited. However, the sacrificial layer 610 should be made of a material that can be dissolved by a specific solution. Here, the specific solution should not dissolve the red semiconductor light emitting device.

Next, the step of etching the growth substrate 510 proceeds. Here, the etching of the growth substrate 510 can be performed by wet etching. When the growth substrate 510 is made of GaAs, the etchant can be a mixed solution of ammonia, hydrogen peroxide, and distilled water.

Next, the step of etching the passivation layer 570 proceeds. Here, the etching of the passivation layer 570 can be performed by wet etching. When the passivation layer 570 is made of $SiO_2$, the etchant can be a mixed solution of hydrofluoric acid and ammonium fluoride. In this process, the passivation layer 570 not covered with the sacrificial layer 610 is etched. Accordingly, a portion of the passivation layer 570 covering the side surface of the semiconductor light emitting device 550 is etched, and a portion of the side surface of the semiconductor light emitting device 550 is exposed to the outside.

The side area of the semiconductor light emitting device 550 exposed to the outside can vary according to the thickness of the passivation layer 570. Specifically, as the passivation layer 570 is thicker, the area of the side surface of the semiconductor light emitting device 550 exposed to the outside increases. In an embodiment, when the passivation layer 570 is relatively thin, only the side surface of the etching stop layer 521 included in the semiconductor light emitting device 550 is exposed to the outside. On the other hand, when the passivation layer 570 is relatively thick, not only the side surface of the etching stop layer 521 but also the side surface of the conductivity type semiconductor layer stacked on the etching stop layer 521 are exposed to the outside. This will be described later.

Finally, the step of etching the sacrificial layer 610 is performed. Here, the etching of the sacrificial layer 610 can be performed by wet etching. The etchant can be formed of an organic solvent capable of selectively dissolving only the sacrificial layer 610. The type of the organic solvent can vary depending on the material constituting the sacrificial layer, and the type of the organic solvent is not specifically limited.

Accordingly, the red semiconductor light emitting devices are dispersed in the solvent. The semiconductor light emitting devices dispersed in the above method can be utilized for self-assembly. As described above, according to the present invention, since the hydrochloric acid-based solution is not used until the red semiconductor light emitting device is manufactured and then dispersed in the fluid, it is possible to prevent the red semiconductor light emitting device from being damaged. In addition, according to the present invention, since there is no lift-off process using a laser, it is possible to significantly lower the probability of damage to the semiconductor light emitting device.

Hereinafter, the semiconductor light emitting device according to the above-described manufacturing method and a display device using the semiconductor light emitting device will be described in detail.

FIG. 13 is a cross-sectional view of a semiconductor light emitting device manufactured by a manufacturing method according to an embodiment of the present invention, and FIG. 14 is a cross-sectional view of a display device using the semiconductor light emitting device according to the present invention.

Referring to FIG. 13, the semiconductor light emitting devices 550a and 550b according to the present invention include first and second conductivity type semiconductor layers 553 and 555, an active layer 554, and first and second conductive electrodes 552 and 556.

A first conductive electrode 552 and an active layer are formed on the first conductivity type semiconductor layer 553, and a second conductivity type semiconductor layer 555 is formed on the active layer. Also, a second conductive electrode 556 is formed on the second conductivity type semiconductor layer 555. In this specification, only the flip-chip type semiconductor light emitting device will be described, but the present invention is not limited thereto, and the present invention can also be applied to a vertical semiconductor light emitting device.

On the other hand, the semiconductor light emitting device 550 according to the present invention is provided with an etching stop layer 521. The etching stop layer 521 can be formed on a surface opposite to one surface of the first conductivity type semiconductor layer 553 on which the first conductive electrode 552 is formed.

Meanwhile, at least a portion of the first and second conductivity type semiconductor layers 553 and 555, the active layer 554, and the first and second conductive electrodes 552 and 556 can be covered with the passivation layer 570'.

Here, the passivation layer 570' is formed to cover only a portion of the side surface of the semiconductor light emitting device. Comparing FIG. 13 (a) and (b), the passivation layer 570' can be formed so as not to cover a portion of the side surface of the etching stop layer 521 and the side surface of the first conductivity type semiconductor layer 553, or completely cover the side surface of the first conductivity type semiconductor layer 553 and not partially cover the side surface of the etching stop layer 521.

The semiconductor light emitting devices are assembled on a substrate in the self-assembly method described with reference to FIGS. 8A to 8E. Hereinafter, a structure of a display device using the above-described red semiconductor light emitting device will be described.

FIG. 14 is a cross-sectional view of a display device according to the present invention.

Referring to FIG. 14, after self-assembly, a passivation layer 270 can be filled between the plurality of semiconductor light emitting devices. More specifically, as described above, the wiring substrate 161 includes a plurality of cells 161d partitioned by barrier wall, and a gap exists between the cells and the semiconductor light emitting device. The passivation layer 270 fills the gap while covering the semiconductor light emitting device together with the barrier wall.

Through this process, a structure in which the passivation layer 270 surrounds the semiconductor light emitting device can be formed in the display. In this case, the passivation layer 270 can be made of a polymer material to be integrated with the barrier wall.

In the display device implemented by the above process, the passivation layer 270 can include a plurality of cells, and the plurality of semiconductor light emitting devices can be accommodated in the cells. That is, in the final structure, the cells provided in the self-assembly step are changed into the inner space of the passivation layer 270. In this case, the plurality of cells are arranged in a matrix structure, and the plurality of pair electrodes 261c have a structure extending to neighboring cells.

Thereafter, a planarization process can be performed so that the upper surface of the passivation layer 270 is planarized, and a contact hole can be formed for wiring. The contact hole can be formed in each of the first conductive electrode 552 and the second conductive electrode 556. Thereafter, wiring electrodes 220 and 240 can be formed on the first and second conductive type electrodes 552 and 556, respectively.

In this case, the semiconductor light emitting device is disposed to be in contact with one surface of the dielectric layer 261b. More specifically, the etching stop layer 521 provided in the semiconductor light emitting device 550 is disposed to contact one surface of the dielectric layer 261b.

The passivation layer 570 is formed along the side surface of the semiconductor light emitting device from a predetermined height or higher with respect to one surface of the substrate 261a in contact with the semiconductor light emitting device, that is, one surface of the dielectric layer 261b.

In the case of manufacturing a display device using the semiconductor light emitting device described in FIG. 13(a), as shown in FIG. 14, the passivation layer 570 is formed to cover a portion of a side surface of the etching stop layer 521, and is formed along a side surface of the semiconductor light emitting device 550 in a direction away from the substrate.

In the case of manufacturing a display device using the semiconductor light emitting device described in FIG. 13(a), although not shown, the passivation layer 570 is formed on the side surface of the conductivity type semiconductor layer stacked on the etching stop layer 521 and is formed along the side surface of the semiconductor light emitting device 550 in a direction away from the substrate.

Meanwhile, the display device according to the present invention can include three types of semiconductor light emitting devices. Specifically, the present invention can include semiconductor light emitting devices that emit blue, green, and red light. The center wavelength of each of the three types of semiconductor light emitting devices is different from each other. Here, the central wavelength of the semiconductor light emitting device means a wavelength with the highest amount of light when the semiconductor light emitting device emits light.

The shape of the passivation layer can vary depending on the type of the semiconductor light emitting device. Specifically, the passivation layer is formed to cover the entire side surface of the blue and green semiconductor light emitting device, but is formed to cover only a part of the side surface of the red semiconductor light emitting device. That is, the passivation layer is formed to cover only a part of the side surface of the semiconductor light emitting device having the largest central wavelength value among the three types of semiconductor light emitting devices, and is formed to cover the entire side surface of the other semiconductor light emitting devices except for the semiconductor light emitting device having the largest central wavelength value among the three types of semiconductor light emitting devices.

As described above, according to the present invention, it is possible to disperse the red semiconductor light emitting device for self-assembly in a fluid without damage to the semiconductor light emitting device.

The invention claimed is:

1. A display device comprising:
a substrate including a plurality of wiring electrodes;
a semiconductor light emitting device electrically connected to the plurality of wiring electrodes; and
a passivation layer disposed to cover the semiconductor light emitting device,
wherein the semiconductor light emitting device comprises:
a first conductivity type semiconductor layer;
an active layer disposed on the first conductivity type semiconductor layer;
a second conductivity type semiconductor layer disposed above the active side;
a first electrode disposed on the first conductivity type semiconductor layer;
a second electrode disposed on the second conductivity type semiconductor layer; and
an etching stop layer disposed below the first conductivity type semiconductor layer, and
wherein the passivation layer exposes a side surface of the etching stop layer, and exposes a part of a side surface of the semiconductor light emitting device.

2. The display device according to claim 1, wherein the passivation layer is disposed along the side surface of the semiconductor light emitting device from a predetermined height or more based on one surface of the substrate in contact with the semiconductor light emitting device.

3. The display device according to claim 1, wherein the semiconductor light emitting device comprises three types of semiconductor light emitting devices having different center wavelengths, and
wherein the passivation layer is disposed to cover only a portion of the side surface of the semiconductor light emitting device having the largest central wavelength value among the three types of semiconductor light emitting devices.

4. The display device according to claim 3, wherein the passivation layer is disposed to cover an entire side surface of the semiconductor light emitting device except for the semiconductor light emitting device having the largest central wavelength value among the three types of semiconductor light emitting devices.

5. The display device according to claim 1, wherein a width of the etching stop layer in contact with one surface of the substrate is greater than a width of the first conductivity type semiconductor layer.

6. The display device according to claim 1, wherein the etching stop layer comprises a GaInP material.

7. The display device according to claim 1, wherein the first conductivity type semiconductor layer comprises a material different from that of the etching stop layer.

8. The display device according to claim 1, wherein the passivation layer disposed on a side surface of the first conductivity type semiconductor layer has a slope.

9. The display device according to claim 1, wherein the side surface of the etching stop layer is provided in a plurality, and
wherein the passivation layer exposes all of the plurality of side surfaces of the etching stop layer.

10. The display device according to claim 1, wherein the etching stop layer includes a compound semiconductor.

11. The display device according to claim 1, wherein a side surface of the first conductivity type semiconductor layer is fully covered by the passivation layer.

12. The display device according to claim 1, wherein an amount of an area exposed at the side surface of the semiconductor light emitting device varies according to a thickness of the passivation layer.

13. The display device according to claim 12, wherein as the area exposed at the side surface of the semiconductor light emitting device increases, the thickness of the passivation layer is increased.

14. The display device according to claim 1, further comprising a plurality of conductive semiconductor layers on the etching stop layer,
wherein the etching stop layer comprises a GaInP material, and
wherein a conductive semiconductor layer of the plurality of conductive semiconductor layers includes at least one of AlGaInP or AlInP.

15. The display device according to claim 1, wherein the passivation layer covers the first electrode disposed on the first conductivity type semiconductor layer.

16. The display device according to claim 1, wherein the passivation layer covers the second electrode disposed on the second conductivity type semiconductor layer.

17. The display device according to claim 1, wherein the passivation layer covers the first electrode disposed on the first conductivity type semiconductor layer and the second electrode disposed on the second conductivity type semiconductor layer.

* * * * *